(12) United States Patent
Chuang et al.

(10) Patent No.: US 9,157,947 B2
(45) Date of Patent: Oct. 13, 2015

(54) COMMUNICATION APPARATUS AND ASSOCIATED ESTIMATION METHOD

(71) Applicant: REALTEK SEMICONDUCTOR CORP., Hsinchu (TW)

(72) Inventors: Sheng-Fu Chuang, Taichung (TW);
Su-Liang Liao, Zhubei (TW);
Liang-Wei Huang, Hsinchu (TW);
Hsuan-Ting Ho, Taichung (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 209 days.

(21) Appl. No.: 14/066,719

(22) Filed: Oct. 30, 2013

(65) Prior Publication Data

US 2014/0118006 A1    May 1, 2014

(30) Foreign Application Priority Data

Oct. 31, 2012  (TW) .............................. 101140283 A

(51) Int. Cl.
*G01R 29/26* (2006.01)
*H04B 1/04* (2006.01)
(52) U.S. Cl.
CPC .............. *G01R 29/26* (2013.01); *H04B 1/0458* (2013.01)
(58) Field of Classification Search
CPC ....................................................... G01R 29/26
USPC ..................................... 324/713, 648; 702/64
See application file for complete search history.

(56) References Cited

U.S. PATENT DOCUMENTS

| | | |
|---|---|---|
| 8,537,728 B2 | 9/2013 | Huang et al. |
| 2009/0063066 A1* | 3/2009 | Maggiolino ............... 702/64 |
| 2010/0208577 A1 | 8/2010 | Huang et al. |

FOREIGN PATENT DOCUMENTS

TW          201032572         9/2010

OTHER PUBLICATIONS

English Abstract translation of TW201032572 (Published Sep. 1, 2010).

* cited by examiner

*Primary Examiner* — Vincent Q Nguyen
(74) *Attorney, Agent, or Firm* — McClure, Qualey & Rodack, LLP

(57) ABSTRACT

A communication apparatus and an associated estimation method are provided. The communication apparatus is electrically connected to a loading terminal and operates at a common bias voltage. The communication apparatus includes a transmitter, a connector, and a receiver. The connector includes a bridging circuit and a measurement circuit. The bridging circuit has a positive measurement end and a negative measurement end. The transmitter transmits an analog output signal. The receiver receives a common bias voltage during an estimation process. During the estimation process, the measurement circuit estimates a positive loading resistance and a negative loading resistance corresponding to the loading terminal according to a voltage difference between the common bias voltage and voltage at one of the positive measurement end and the negative measurement end.

30 Claims, 9 Drawing Sheets

| Rsp | Vhp-Vcm |
|---|---|
| 30 Ω | $-\frac{1}{6} \times Tx^-$ |
| 40 Ω | $-\frac{2}{27} \times Tx^-$ |
| 50 Ω | 0 |
| 60 Ω | $\frac{2}{33} \times Tx^-$ |

COMMUNICATION APPARATUS AND ASSOCIATED ESTIMATION METHOD

This application claims the benefit of Taiwan application Serial No. 101140283, filed Oct. 31, 2012, the subject matter of which is incorporated herein by reference.

BACKGROUND OF THE INVENTION

1. Field of the Invention

The invention relates in general to a communication apparatus and an associated estimation method.

2. Description of the Related Art

FIG. 1 is a schematic diagram illustrating a conventional technology which connects a communication apparatus and a remote apparatus through a transmission line. For example, the communication apparatus 101 can be a switch, and the remote apparatus 112 can be a personal computer. In practical application, the communication apparatus 101 and the remote apparatus 112 can transmit data via various types of mechanisms.

Each of the communication apparatus 101 and the remote apparatus 112 includes a transmitter and a receiver. The transmitting and receiving operations in the communication apparatus 101 and the remote apparatus 112 are compensate and corresponding to each other. As the transmitting and receiving operations of the communication apparatus and the remote apparatus are similar, only the operations of the communication apparatus 101 are described.

The communication apparatus 101 generates a positive and a negative transmission signal ($Tx^+$ and $Tx^-$) through the transmitter 102. The positive and the negative transmission signal ($Tx^+$ and $Tx^-$) are transmitted to the remote apparatus 112 through a connector and a transmission line. The connector 104 includes a transformer, a positive output impedance $Rs^+$, and a negative output impedance $Rs^-$. The positive and the negative output impedance ($Rs^+$ $Rs^-$) matches the impedance of the transmission line.

Similarly, the remote apparatus 112 transmits data to the communication apparatus 101 through the transmission line 111. In response to the remote apparatus 112, a receiver 103 is used by the communication apparatus 101 to receive a positive and a negative reception signal ($Rx^+$ and Rx−).

As indicated in FIG. 1, the positive transmission signal $Tx^+$, and signal the positive reception signal $Rx^+$ share the same wire. The negative transmission and reception signal ($Tx^-$ and $Rx^-$) share the same wire. If the design of the communication apparatus 101 is poor, the receiver 103 receives the positive and the negative transmission signal ($Tx^+$ and $Tx^-$) sent from the transmitter 102. Instead of receiving only the positive and the negative reception signal ($Rx^+$, $Rx^-$) transmitted from the remote apparatus 112, the signal received by the communication apparatus 101 is mixed with the positive and the negative transmission signal ($Tx^+$, $Tx^-$) and the positive and the negative reception signal ($Rx^+$, $Rx^-$).

When any of the reception signals (the positive/negative reception signals $Rx^+$ and $Rx^-$) received by the receiver 103 is interfered by the transmission signals (the positive/negative transmission signals $Tx^+$ and $Tx^-$) from the transmitter 102, such phenomenon is referred as echo phenomenon. Echo phenomenon is an important issue while manufacturing the communication apparatus 101.

As well as the echo phenomenon, the communication apparatus also needs to consider the problem of electromagnetic interference (hereinafter, EMI).

For the transmitter of FIG. 1, a loop is formed at the left hand side of the transformer. Meanwhile, a positive and a negative loading cu rents ($I_{Lp}$ and $I_{Ln}$) respectively flowing off and flowing into the communication apparatus are equivalent. In such case, the impedance affect less on the loop current of FIG. 1.

Due to cost consideration, communication products with AC coupling are now available in the market. With AC coupling mechanism, cost of transformer is reduced. Although cost can be reduced by such replacement, the problem of current mismatch arises. Furthermore, current mismatch will cause EMI to the communication apparatus.

According to the specifications of network joint (RJ45), ideal impedance of the network wire is 50Ω. Before the communication apparatus leaves the factory, 50Ω is used as the positive output impedance $Rs^+$, and the negative output impedance $Rs^-$. However, tolerance of an RJ45 impedance is up to 15%. This implies that the impedances of the loading terminal may range between 42.5Ω to 57.5Ω. The impedances of the loading terminal being not conformed to ideal magnitudes defined in specifications will cause current mismatch in the communication apparatus.

FIG. 2 is a schematic diagram illustrating another conventional technology which connects the communication apparatus and the remote apparatus through the transmission line. FIGS. 1 and 2 basically have the same design except that the transformer of FIG. 1 is replaced by two capacitors for AC coupling. The communication apparatus 201 generates the positive and the negative transmission signal ($Tx^+$ and $Tx^-$) through the transmitter 202. The positive and the negative transmission signals ($Tx^+$ and $Tx^-$) are transmitted to the remote apparatus 212 through the connector 204 and the transmission line 211. The receiver 203 receives the positive and the negative reception signal ($Rx^+$ and $Rx^-$) generated by the loading terminal 210.

In FIG. 2, a common mode current will be generated between the communication apparatus 201 and the loading terminal 210 when the impedances at the two ends of the loading terminal 210 in the communication apparatus 201 are not symmetric.

The common mode current occurs when magnitudes of the positive and the negative loading currents ($I_{Lp}$ and $I_{Ln}$) are not equivalent.

In FIG. 2, the communication apparatus 201 adopts the AC coupling mechanism. Hence, a common mode current will be generated due to the asymmetric resistances of the loading terminal 210. Once the common mode current is transmitted back to ground, a current loop will be formed, and noises and EMI phenomenon will accordingly occur.

Along with the development of communication products, the requirement of EMI protection is getting more strict. Take network products for example, the requirement of EMI protection in new standard is 30 dB higher than the old one. This implies that EMI phenomenon of network products is required to be reduced to one thousandth of the old one.

To be comply with the strength standard of EMI, a metal shielding method is normally used to block EMI phenomenon according to conventional technologies. However, the metal shielding method is a passive approach, and does not actually reduce the strength of EMI phenomenon. Moreover, such approach uses extra metal, and the cost of manufacturing would increase.

As disclosed above, EMI and echo phenomenon are problems left unresolved in the conventional communication products.

SUMMARY OF THE INVENTION

According to one embodiment of the present invention, a communication apparatus is provided. The communication apparatus is electrically connected to a loading terminal and operates at a common bias voltage. The communication apparatus includes a transmitter, a connector, and a receiver. The transmitter transmits an analog output signal. The connector includes a bridging circuit and a receiver. The bridging circuit is electrically connected between the transmitter and the loading terminal, and has a positive measurement end and a negative measurement end. The measurement circuit is electrically connected between the bridging circuit, the transmitter and the loading terminal. The receiver is electrically connected to the bridging circuit and receives a common bias voltage during an estimation process. During the estimation process, the measurement circuit estimates a positive loading resistance and a negative loading resistance corresponding to the loading terminal according to a voltage difference between the common bias voltage and voltage at one of the positive measurement end and the negative measurement end.

According to another embodiment of the present invention, a resistance estimation method is provided. The estimation method is used in a communication apparatus which is electrically connected to a loading terminal and operates at a common bias voltage. The communication apparatus includes a transmitter, a connector, and a receiver. The transmitter transmits an analog output signal. The connector includes a bridging circuit, and a measurement circuit. The bridging circuit has a positive measurement end, and a negative measurement end. The estimation method includes following steps: An analog output signal is transmitted by the transmitter. A common bias voltage is received by the receiver during an estimation process. During the estimation process, a positive loading resistance and a negative loading resistance corresponding to the loading terminal are estimated by the measurement circuit according to a voltage difference between the common bias voltage and voltage at one of the positive measurement end and the negative measurement end.

The above and other aspects of the invention will become better understood with regard to the following detailed description of the preferred but non-limiting embodiment (s). The following description is made with reference to the accompanying drawings.

DETAILED DESCRIPTION OF THE INVENTION

Based on the above descriptions, design of the communication apparatus must take EMI and echo phenomenon into consideration. EMI phenomenon results from the imbalanced positive and the negative loading current ($I_{Lp}$ and $I_{Ln}$). Echo phenomenon is generated when the positive and the negative reception signal (Rx⁺ and Rx⁻) are affected by the asymmetric positive and the negative transmission signal (Tx⁺ and Tx⁻).

Figure 1:
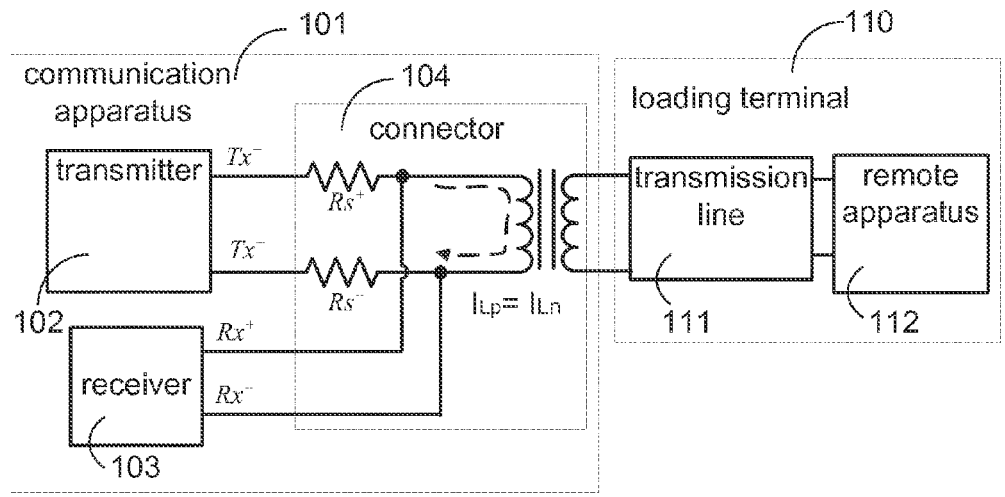
FIG. 1 (prior art) shows a schematic diagram illustrating a conventional technology which connects a communication apparatus and a remote apparatus through a transmission line.
Figure 2:
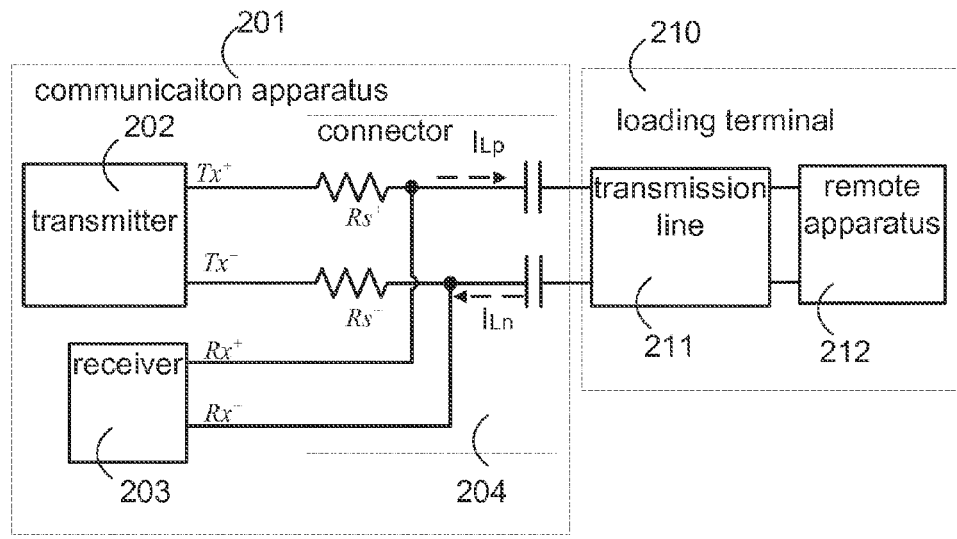
FIG. 2 (prior art) shows a schematic diagram illustrating another conventional technology which connects the communication apparatus and the remote apparatus through the transmission line.
Figure 3A:
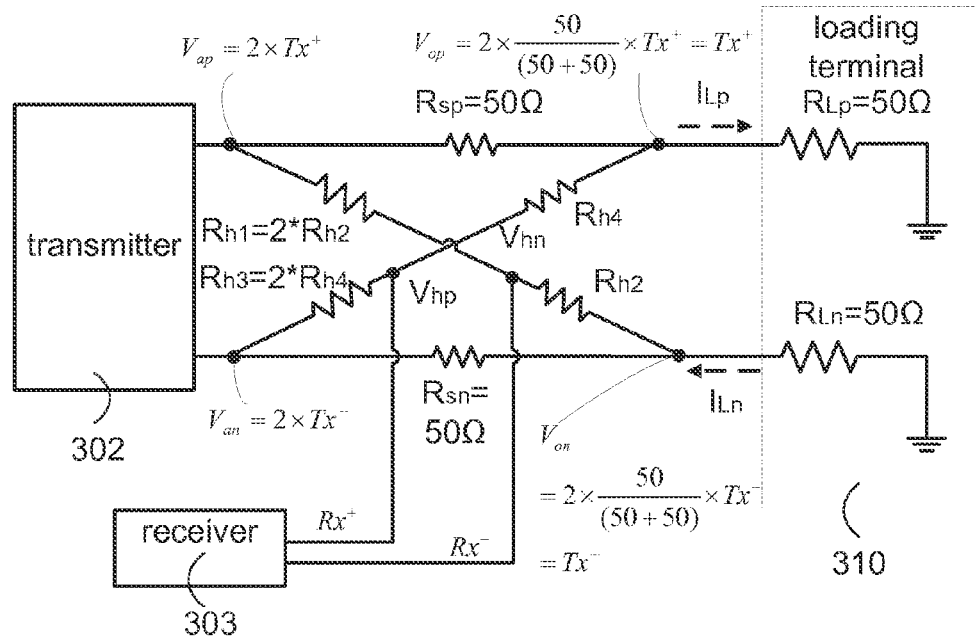
FIG. 3A shows a schematic diagram illustrating that the resistances corresponding to the loading terminal is conformed to RJ45 specifications.

FIG. 3A is a schematic diagram illustrating that the resistances corresponding to the loading terminal is conformed to RJ45 specifications.

For convenience of descriptions, the loading terminal 310 is considered to be equivalent to two single-end resistances. Being grounded, the two single-end resistances are represented as a positive and a negative loading resistance ($R_{Lp}$ and $R_{Ln}$) corresponding to the loading terminal. When the transmission line complies with the ideal RJ45 specifications, both the positive and the negative loading resistance ($R_{Lp}$ and $R_{Ln}$) corresponding to the loading terminal are equivalent to 50Ω.

The signal outputted at a positive output of an amplifier in the transmitter 302 is ($V_{cm}$+2Tx⁺). In addition, the signal outputted at a negative output of an amplifier in the transmitter 302 is ($V_{cm}$+2Tx⁻).

Common bias voltage $V_{cm}$ denotes the voltage when the system is in a common mode, and it is about 1.5V. Operation of the communication apparatus is based on the common bias voltage $V_{cm}$, that is, each signal uses the common bias voltage $V_{cm}$ as a comparison basis. In subsequent descriptions, the common bias voltage $V_{cm}$ is omitted. For instance, the signals outputted at the positive/negative output of the amplifier in the transmitter 302 are merely represented by 2Tx⁺ and 2Tx⁻ respectively.

The positive measurement resistance $R_{sp}$ is electrically connected in between the positive output of the amplifier and the positive loading resistance $R_{Lp}$ of the transmitter 302. The negative measurement resistance $R_{sn}$ is electrically connected in between the negative output of the amplifier and the negative loading resistance $R_{Ln}$ of the transmitter 302.

Next, the current flowing through the positive loading resistance $R_{Lp}$ is defined as a positive loading current $I_{Lp}$. Thus, according to the voltage at the positive output of the loading terminal $V_{op}$ and the positive loading resistance $R_{Lp}$, the positive loading current $I_{Lp}$ can be obtained. The positive loading current $I_{Lp}$ is expressed in Equation 1.

$$I_{Lp} = \frac{V_{op}}{R_{Lp}} = \frac{V_{op}}{50} \quad \text{(Equation 1)}$$

According to the voltage at the positive output of the amplifier $V_{ap}$ and a resistive divider composed of the positive measurement resistance $R_{sp}$ and the positive loading resistance $R_{Lp}$, the voltage at the positive output of the loading terminal $V_{op}$ can be obtained. The voltage at the positive output of the loading terminal $V_{op}$ is expressed in Equation 2.

$$V_{op} = V_{ap} \times \frac{R_{Lp}}{(R_{Lp} + R_{sp})} \quad \text{(Equation 2)}$$

Given that both the positive measurement resistance $R_{sp}$, and the positive loading resistance $R_{Lp}$ are equivalent to $50\Omega$, the voltage at the positive output of the loading terminal $V_{op}$ of FIG. 3A can be obtained according to Equation 2. The voltage at the positive output of the loading terminal $V_{op}$ is expressed in Equation 3.

$$V_{op} = 2Tx^+ \times \frac{50}{(50+50)} = Tx^+ \quad \text{(Equation 3)}$$

Then, the current flowing through the negative loading resistance $R_{Ln}$ is defined as a negative loading current $I_{Ln}$. According to the voltage at the negative output of the loading terminal $V_{on}$ and the negative loading resistance $R_{Ln}$, the negative loading current $I_{Ln}$ can be obtained. The negative loading current $I_{Ln}$ is expressed in Equation 4.

$$I_{Ln} = \frac{V_{on}}{R_{Ln}} = \frac{V_{on}}{50} \quad \text{(Equation 4)}$$

According to the voltage at the negative output of the amplifier $V_{an}$ and a resistive divider composed of the negative measurement resistance $R_{sn}$ and the negative loading resistance $R_{Ln}$, the voltage at the negative output of the loading terminal $V_{on}$ can be obtained. The voltage at the negative output of the loading terminal $V_{on}$ is expressed in Equation 5.

$$V_{on} = V_{an} \times \frac{R_{Ln}}{(R_{Ln} + R_{sn})} \quad \text{(Equation 5)}$$

Given that both the negative measurement resistance $R_{sn}$ and the negative loading resistance $R_{Ln}$ are $50\Omega$, the voltage at the negative output of the loading terminal $V_{on}$ of FIG. 3A can be obtained according to Equation 5. The voltage at the negative output of the loading terminal $V_{on}$ is expressed in Equation 6.

$$V_{on} = 2Tx^- \times \frac{50}{(50+50)} = Tx^- \quad \text{(Equation 6)}$$

As indicated in Equation 1 and Equation 4, when the communication apparatus adopts the above resistance disposition, and the impedance of the loading terminal 310 is conformed to the specification being $50\Omega$, the current flowing to the communication apparatus $I_{Ln}$ is equivalent to the current flowing off the communication apparatus $I_{Lp}$. That is, the positive and the negative loading current are equivalent ($I_{Lp}=I_{Ln}$). In such case, no EMI phenomenon will occur.

Moreover, the positive output of the amplifier is electrically connected to the negative loading resistance $R_{Ln}$ through a first and a second bridging resistance ($R_{h1}$ and $R_{h2}$). The negative output of the amplifier is electrically connected to the positive loading resistance $R_{Lp}$ through a third and a fourth bridging resistance ($R_{h3}$ and $R_{h4}$).

According to the design of the present invention, the bridging resistances ($R_{h1}$, $R_{h2}$, $R_{h3}$, $R_{h4}$) connect the positive and the negative loading resistance of the loading terminal ($R_{Ln}$, $R_{Lp}$) and the positive and the negative output of the amplifier. Magnitudes of these bridging resistances satisfy Equation 7.

$$R_{h1} = 2 \times R_{h2}$$

$$R_{h3} = 2 \times R_{h4} \quad \text{(Equation 7)}$$

The junction between the third and the fourth bridging resistance ($R_{h3}$ and $R_{h4}$) is defined as a positive measurement end. During data transmission process, the voltage at the positive measurement end $V_{hp}$ provides the positive reception signal $Rx^+$ to the receiver 303 (i.e. $V_{hp}=Rx^+$).

Thus, the voltage at the positive measurement end $V_{hp}$ can be obtained according to a voltage difference ($V_{an}-V_{op}$) between the voltage at the negative output of the amplifier $V_{an}$ and the voltage at the positive output of the loading terminal $V_{op}$, and proportion of the third bridging resistance $R_{h3}$ to the fourth bridging resistance $R_{h4}$. The voltage at the positive measurement end $V_{hp}$ is expressed in Equation 8.

$$\begin{aligned} V_{hp} &= Rx^+ \\ &= \left(\frac{1}{3}V_{an} + \frac{2}{3}V_{op}\right) \\ &= \frac{1}{3} \times 2Tx^+ + \frac{2}{3} \times Tx^- \\ &= \frac{2}{3}Tx^+ + \frac{2}{3}Tx^- \end{aligned} \quad \text{(Equation 8)}$$

It is assumed that magnitudes of the positive and the negative transmission signal ($Tx^+$ and $Tx^-$) are equivalent, but directions of which are opposite (i.e. $Tx^-=-Tx^+$). Thus, the equation of $V_{hp}=Rx^+$ can be further simplified in Equation 9.

$$V_{hp}=Rx^+=0 \quad \text{(Equation 9)}$$

Similarly, the junction between the first and the second bridging resistance ($R_{h1}$ and $R_{h2}$) is defined as a negative measurement end. During data transmission process, the voltage at the negative measurement end $V_{hn}$ provides negative reception signal $Rx^-$ to the receiver 303 (i.e. $V_{hp}=Rx^-$).

Thus, the voltage at the negative measurement end $V_{hn}$ can be obtained according to a voltage difference ($V_{ap}-V_{on}$) between the voltage at the positive output of the amplifier $V_{ap}$ and the voltage at the negative output of the loading terminal $V_{on}$, and proportion of the first bridging resistance $R_{h1}$ to the second bridging resistance $R_{h2}$. The voltage at the negative measurement end $V_{hn}$ is expressed in Equation 10.

$$V_{hn} = R^- \quad \text{(Equation 10)}$$
$$= \left(\frac{1}{3}V_{ap} + \frac{2}{3}V_{on}\right)$$
$$= \frac{1}{3}(2Tx^-) + \frac{2}{3}(Tx^+)$$
$$= 0$$

According to Equation 9 and Equation 10, it is shown that echo phenomenon will not occur to the communication apparatus when both the positive and the negative reception signal ($Rx^+$ and $Rx^-$) are 50Ω ($Rx^+=Rx^-=50Ω$). That is, if magnitudes of the positive and the negative resistance corresponding to the loading terminal are conformed to specifications, the EMI and echo phenomenon are eliminated in the communication apparatus.

However, as indicated in FIG. 3A, the actual positive and the negative loading resistance ($R_{Lp}$ and $R_{Ln}$) of the loading terminal 310 are not always 50Ω. For example, only the positive loading resistance $R_{Lp}$ is 50Ω, but the negative loading resistance $R_{Ln}$ is 30Ω. Then, EMI, and/or echo phenomenon may correspondingly occur.

Figure 3B:
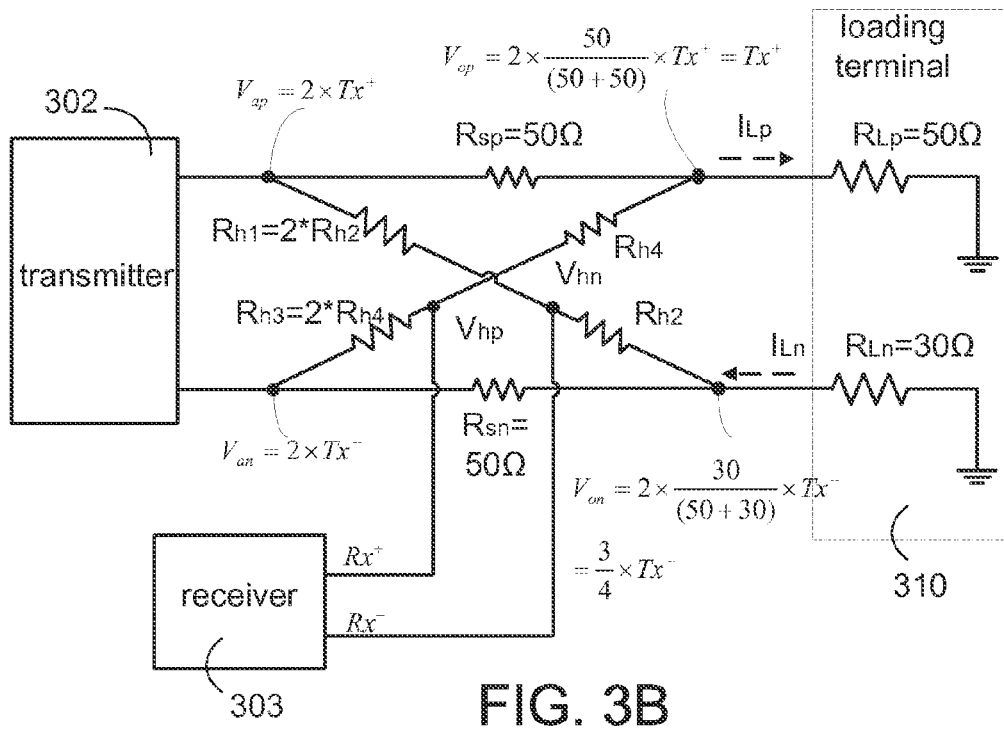
FIG. 3B shows a schematic diagram illustrating that the resistances corresponding to the loading terminal is not conformed to RJ45 specifications.

FIG. 3B is a schematic diagram illustrating that the resistances corresponding to the loading terminal are not conformed to RJ45 specifications.

According to the circuit disposition of FIG. 3B, EMI and/or echo phenomenon will occur. The above judgment steps about whether EMI and/or echo phenomenon occur are inducted as follows.

(Step 1) According to the voltage at the positive output of the amplifier ($V_{ap}=2Tx^+$) and a resistive divider composed of the positive measurement resistance $R_{sp}$ and the positive loading resistance $R_{Lp}$, the voltage at the positive output of the loading terminal $V_{op}$ can be obtained. The voltage at the positive output of the loading terminal $V_{op}$ is expressed in Equation 11.

$$V_{op} = \frac{50}{(50+50)} \times 2Tx^+ = Tx^+ \quad \text{(Equation 11)}$$

(Step 2) The positive loading current $I_{Lp}$ can be obtained according to Equation 11 and the positive loading resistance $R_{Lp}$. The positive loading current $I_{Lp}$ is expressed in Equation 12.

$$I_{Lp} = \frac{V_{op}}{R_{Lp}} = Tx^+ \times \frac{1}{50} = \frac{Tx^+}{50} \quad \text{(Equation 12)}$$

(Step 3) According to the voltage at the negative output of the amplifier ($V_{an}=2Tx^-$) and a resistive divider composed of the negative measurement resistance $R_{sn}$ and the negative loading resistance $R_{Ln}$, the voltage at the negative output of the loading terminal $V_{on}$ can be obtained. The voltage at the negative output of the loading terminal $V_{on}$ is expressed in Equation 13.

$$V_{on} = \frac{30}{(50+30)} \times 2Tx^- = \frac{3}{4} \times Tx^- \quad \text{(Equation 13)}$$

(Step 4) The negative loading current $I_{Ln}$ can be obtained according to Equation 13 and the negative loading resistance $R_{Ln}$. The negative loading current $I_{Ln}$ is expressed in Equation 14.

$$I_{Ln} = \frac{V_{on}}{R_{Ln}} = \frac{3}{4} \times Tx^- \times \frac{1}{30} = \frac{Tx^-}{40} \quad \text{(Equation 14)}$$

(Step 5) Equation 15 compares the magnitudes of the positive loading current $I_{Lp}$ according to Equation 12, and the negative loading current $I_{Ln}$ according to Equation 14.

$$I_{Lp} = \frac{Tx^+}{50} \neq I_{Ln} = \frac{Tx^-}{40} \quad \text{(Equation 15)}$$

Given that magnitudes of the positive and the negative loading current ($I_{Lp}$, and $I_{Ln}$) are not equivalent as indicated in FIG. 3B, comparison results of Equation 15 implies that EMI phenomenon exists in the communication apparatus.

(Step 6) With reference to Equation 8, the voltage at the positive measurement end $V_{hp}$ can be obtained according to a resistive divider composed of the third and the fourth bridging resistance ($R_{h3}$ and $R_{h4}$). The voltage at the positive measurement end $V_{hp}$ is expressed in Equation 16.

$$V_{hp} = \quad \text{(Equation 16)}$$
$$\left(\frac{1}{3}V_{an} + \frac{2}{3}V_{op}\right) = \frac{1}{3}(2Tx^-) + \frac{2}{3}(Tx^+) = \frac{2}{3}Tx^- + \frac{2}{3}Tx^+ = 0$$

(Step 7) With reference to Equation 10, the voltage at the negative measurement end $V_{hn}$ can be obtained according to a resistive divider composed of the first and the second bridging resistance ($R_{h1}$ and $R_{h2}$). The voltage at the negative measurement end $V_{hn}$ is expressed in Equation 17.

$$V_{hn} = R^- = \left(\frac{1}{3}V_{ap} + \frac{2}{3}V_{on}\right) = \quad \text{(Equation 17)}$$
$$\frac{1}{3}(2Tx^+) + \frac{2}{3}\left(\frac{3}{4}Tx^-\right) = \left(\frac{2}{3}Tx^+ + \frac{1}{2}Tx^-\right) = \frac{1}{6}Tx^+$$

(Step 8) Equation 18 compares the voltage at the positive and the negative measurement end ($V_{hp}$ and $V_{hn}$) according to Equation 16 and Equation 17.

$$V_{hp} = 0 \neq V_{hn} = \frac{1}{6}Tx^+ \quad \text{(Equation 18)}$$

Equation 18 indicates that the positive and the negative reception signal ($Rx^+$ and $Rx^-$) of FIG. 3B are not equivalent. Thus, echo phenomenon will occur to the communication apparatus of FIG. 3B.

To summarize, when physical loading terminal varies with environment and/or materials etc., the actual positive and the negative loading resistance ($R_{Lp}$ and $R_{Ln}$) may not be balanced. Accordingly, variation of the actual positive and the negative loading resistance ($R_{Lp}$ and $R_{Ln}$) will result in EMI and echo phenomenon.

However, when the communication apparatus are manufactured, the actual magnitudes of the positive and the negative loading resistance are unknown. Therefore, the communication apparatus must be capable of dynamically estimating the positive and the negative loading resistance ($R_{Lp}$ and $R_{Ln}$). Besides, the communication apparatus must be capable of adjusting the settings of the internal resistances according to the estimated results of the positive/negative loading resistance.

Figure 4A:
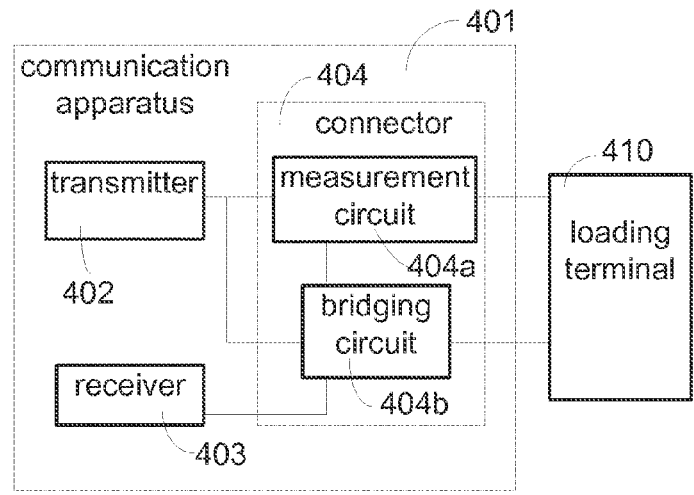
FIG. 4A shows a block diagram of a communication apparatus of the invention.

Referring to FIG. 4A, a block diagram of a communication apparatus of the invention is shown. The communication apparatus of the invention is electrically connected to a remote apparatus through a transmission line. The transmission line and the remote apparatus can be regarded as the loading terminal 410. The communication apparatus 401 of the invention operates at the common bias voltage $V_{cm}$.

Wherein, the transmitter outputs an analog output signal through the positive and the negative output of the amplifier. The connector 404 is electrically connected to the loading terminal 410 through the positive and negative output of the loading terminal.

The communication apparatus 401 of the invention includes a transmitter 402, a connector 404, and a receiver 403. The connector 404 includes a bridging circuit 404b and a measurement circuit 404a. The bridging circuit 404b is electrically connected between the transmitter 402 and the loading terminal 410. The measurement circuit 404a is electrically connected between the bridging circuit 404b, the transmitter 402, and the loading terminal 410. Besides, the bridging circuit 404b has a positive and a negative measurement end.

When the communication apparatus 401 transmits data, the positive measurement end provides the positive reception signal $Rx^+$ to the receiver 403, and the negative measurement end provides the negative reception signal $Rx^-$ to the receiver 403.

Firstly, the transmitter 402 transmits an analog output signal including the positive and the negative transmission signal ($Tx^+$ and $Tx^-$). Then, the analog output signal is outputted to the loading terminal 410 through the connector 404.

According to the concept of the invention, an estimation process is performed before the communication apparatus 401 transmits data. After the positive and the negative loading resistance ($R_{Lp}$ and $R_{Ln}$) of the loading terminal 410 are estimated, resistance settings of the communication apparatus 401 are correspondingly adjusted. By adjusting resistance settings, problems caused by EMI and/or echo phenomenon during data transmission can be largely eliminated. After that, data are transmitted between the communication apparatus 401 and the remote apparatus.

In addition to receiving the positive and the negative reception signal ($Rx^+$ and $Rx^-$), the receiver 403 further receives a common bias voltage $V_{cm}$ during the estimation process. A positive voltage difference ($V_{hp}-V_{cm}$) is defined as voltage difference between the voltage at the positive measurement end $V_{hp}$ and the common bias voltage $V_{cm}$. A negative voltage difference ($V_{hn}-V_{cm}$) is defined as voltage difference between the voltage at the negative measurement end $V_{hn}$ and the common bias voltage $V_{cm}$.

With the positive voltage difference ($V_{hp}-V_{cm}$), the measurement circuit 404a is capable of estimating the positive loading resistance $R_{Lp}$ corresponding to the loading terminal 410. Likewise, with the negative voltage difference, the measurement circuit 404a is capable of estimating the negative loading resistance $R_{Ln}$ corresponding to the loading terminal 410.

Following that, the transmitter 402, the measurement circuit 404a, and the bridging circuit 404b will adjust resistance settings according to the estimated positive and the estimated negative loading resistance ($R_{Lp}$ and $R_{Ln}$).

After the estimation process, the receiver 403 receives an analog input signal including the positive and the negative reception signal ($Rx^+$ and $Rx^-$). The positive reception signal $Rx^+$ is received via the positive measurement end, and the negative reception signal $Rx^-$ is received via the negative measurement end.

Figure 4B:
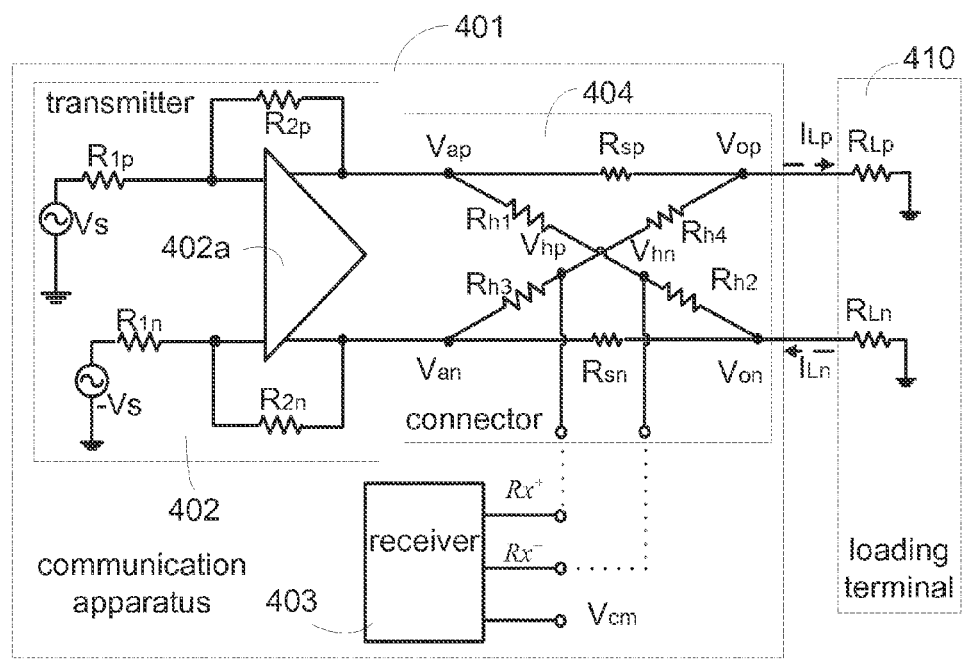
FIG. 4B shows a schematic diagram illustrating the internal dispositions of the transmitter and/or the connector, and the input terminals of the receiver according to the communication apparatus as shown in FIG. 4A.

FIG. 4B is a schematic diagram illustrating the internal dispositions of the transmitter and/or the connector, and the input terminals of the receiver according to the communication apparatus as shown in FIG. 4A.

The measurement circuit 404a includes a positive and a negative measurement resistance ($R_{sp}$ and $R_{sn}$). The positive measurement resistance $R_{sp}$ is electrically connected between the positive output of the amplifier and the positive output of the loading terminal. The negative measurement resistance $R_{sn}$ is electrically connected between the negative output of the amplifier and the negative output of the loading terminal.

The bridging circuit 404b includes a first and a second bridging path. The first bridging path is formed by the first and the second bridging resistance ($R_{h1}$ and $R_{h2}$). The second bridging path is formed by the third and the fourth bridging resistance ($R_{h3}$ and $R_{h4}$).

The first bridging resistance $R_{h1}$ is electrically connected between the positive output of the amplifier and the negative measurement end. The second bridging resistance $R_{h2}$ is electrically connected between the negative measurement end and the negative output of the loading terminal. The third bridging resistance $R_{h3}$ is electrically connected between the negative output of the amplifier and the positive measurement end. The fourth bridging resistance $R_{h4}$ is electrically connected between the positive measurement end and the positive output of the loading terminal.

The analog output signal includes the positive and the negative transmission signal ($Tx^+$ and $Tx^-$). The transmitter 402 includes an amplifier 402a, a first resistance at a positive source $R_{1p}$, a second resistance at the positive source $R_{2p}$, a first resistance at a negative source $R_{1n}$, and a second resistance at the negative source $R_{2n}$.

The amplifier 402a further includes a positive and a negative input, together with a positive and a negative output. The positive transmission signal $Tx^+$ is outputted through the positive output of the amplifier 402a, and the negative transmission signal $Tx^-$ is outputted through the negative output of the amplifier 402a.

The first resistance at the positive source $R_{1p}$ is electrically connected between the positive signal source $V_s$ and the positive input of the amplifier 402a. The second resistance at the positive source $R_{2p}$ is electrically connected between the positive input and the positive output of the amplifier 402a. The voltage at the positive output of the amplifier $V_{ap}$ is generated according to a voltage provided by the positive signal source (Vs), and proportion of the first resistance at the positive source $R_{1p}$ to the second resistance at the positive source $R_{2p}$.

The first resistance at the negative source $R_{1n}$ is electrically connected between the negative signal source ($-V_s$) and the negative input of the amplifier 402a. The second resistance at the negative source $R_{2n}$ is electrically connected between the negative input and the negative output of the amplifier 402a. The voltage at the negative output of the amplifier $V_{an}$ is generated according to a voltage provided by the negative signal source (−V$_s$), and proportion of the first resistance at the negative source R$_{1n}$ to the second resistance at the negative source R$_{2n}$.

Moreover, the receiver 403 of the present invention includes three input terminals, namely, the input terminal of the positive reception signal (R$_x^+$), the input terminal of the negative reception signal R$_x^-$, and the input terminal of the common bias voltage V$_{cm}$. The input terminal of the positive reception signal R$_x^+$ is electrically connected to the positive measurement end V$_{hp}$. The input terminal of the negative reception signal R$_x^-$ is electrically connected to the negative measurement end V$_{hn}$. The input terminal of the common bias voltage V$_{cm}$ is used for receiving the common bias voltage V$_{cm}$.

Since the actual magnitudes of the positive and negative loading resistance (R$_{Lp}$ and R$_{Ln}$) are unknown in advance, the present invention provides a method to estimate the positive and negative loading resistances (R$_{Lp}$, R$_{Ln}$) soon after the communication apparatus 401 is physically connected to the loading terminal 410. For convenience of descriptions, is assumed that the positive loading resistance R$_{LP}$ is equivalent to 50Ω, and the negative loading resistance R$_{Ln}$ is equivalent to 30Ω in the following embodiment.

It should be noted that when the communication apparatus 401 is in the estimation process, depending on which loading resistance (R$_{Lp}$ or R$_{Ln}$) is estimated, the communication apparatus 401 compares the common bias voltage V$_{cm}$ with different comparison objects.

When the measurement circuit 404a estimates the positive loading resistance R$_{Lp}$ the voltage at input terminal of the positive reception signal (Rx$^+$) and the voltage at the input terminal of the common bias voltage (V$_{cm}$) are compared. When magnitude of the positive measurement resistance R$_{sp}$ changes, the voltage at the positive measurement end V$_{hp}$ varies accordingly, so as the positive voltage difference (V$_{cm}$−V$_{hp}$).

When the measured positive voltage difference (V$_{hp}$−V$_{cm}$) is equivalent to 0, it is correspondingly judged that the positive measurement resistance R$_{sp}$ is equivalent to the actual positive loading resistance R$_{Lp}$. The above procedures can be referred to the descriptions of FIGS. 5A, 5B, and 6.

When the measurement circuit 404a estimates the negative loading resistance R$_{Ln}$, the voltage at the input terminal of the negative reception signal (Rx−) and the voltage at the input terminal of the common bias voltage (V$_{cm}$) are compared. When magnitude of the negative measurement resistance R$_{sn}$ changes, the voltage at the negative measurement end V$_{hn}$ varies accordingly, so as the negative voltage difference (V$_{cm}$−V$_{hn}$).

When the measured negative voltage difference (V$_{hn}$−V$_{cm}$) is equivalent to 0, it is correspondingly judged that the negative measurement resistance R$_{sn}$ is equivalent to the negative loading resistance R$_{Lp}$. The above procedures can be referred to the descriptions of FIG. 7.

Figures 5A, 5B:
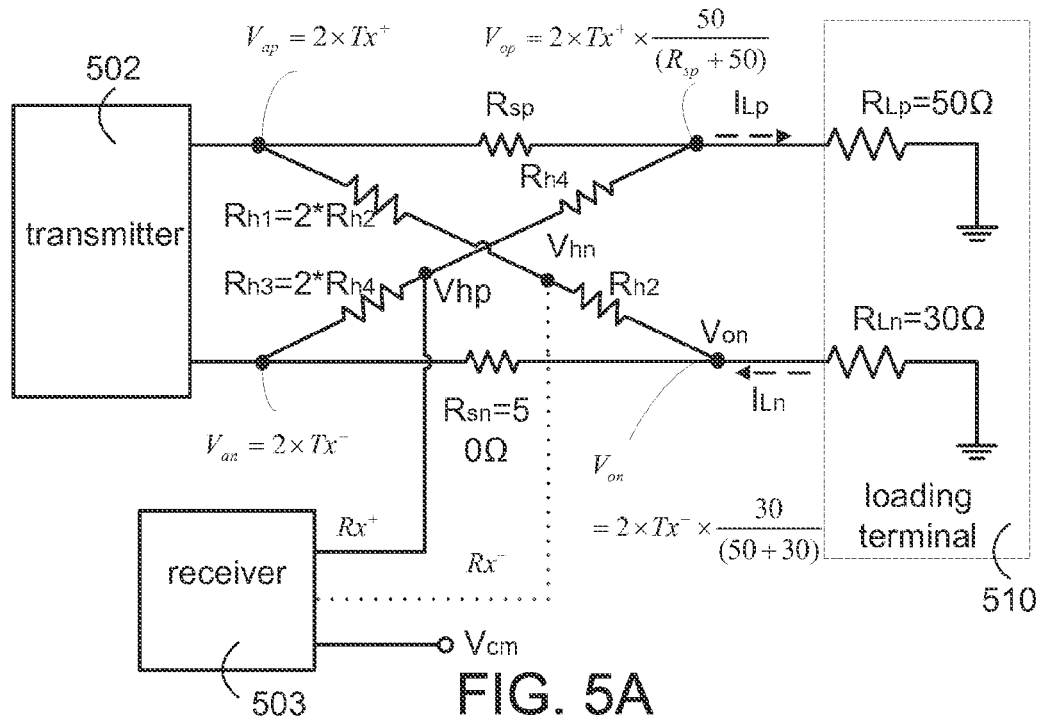
FIG. 5A shows a schematic diagram illustrating how the positive loading resistance $R_{Lp}$ is estimated by an adjustable positive measurement resistance Rsp according to the concept of the invention.
FIG. 5B shows a diagram illustrating how the positive voltage difference ($V_{hp}$-$V_{cm}$) changes when the positive measurement resistance $R_{sp}$ is set to be equivalent to 60, 50, 40, 30Ω respectively.

Firstly, FIG. 5A discloses how the positive loading resistance R$_{Lp}$ is estimated through the adjustment of the positive measurement resistance R$_{sp}$. FIG. 5B further illustrates how the positive voltage difference (V$_{hp}$−V$_{cm}$) changes when the positive measurement resistance R$_{sp}$ is equivalent to 60Ω, 50Ω, 40Ω, and 30Ω respectively.

FIG. 5A illustrates the estimation of the actual magnitude of the positive loading resistance R$_{Lp}$ according to the concept of the invention.

Given that actual positive loading resistance R$_{Lp}$ is unknown, the embodiment estimates the positive loading resistance R$_{Lp}$ by adjusting magnitudes of the positive measurement resistance R$_{sp}$.

According to the embodiment of the present invention, an error range is defined. With the error range, different magnitudes of a plurality of positive measurement resistances R$_{sp}$ are provided. Moreover, through the input terminals of the receiver 503, the positive voltage difference (V$_{hp}$−V$_{cm}$) is correspondingly measured whenever magnitude of the positive measurement resistance R$_{sp}$ is changed.

After a plurality of positive voltage differences are obtained, the measurement circuit judges the magnitude of the positive loading resistance R$_{Lp}$ by comparing the plurality of positive voltage differences.

FIG. 5B is a table listing how the positive voltage difference (V$_{hp}$−V$_{cm}$) varies when the positive measurement resistance R$_{sp}$ is set to be equivalent to 60, 50, 40, and 30Ω.

When the positive measurement resistance R$_{sp}$ is respectively set as 60, 50, 40, and 30Ω, voltage at the positive measurement end V$_{hp}$ is measured accordingly.

When the positive measurement resistance R$_{sp}$ is equivalent to 60Ω, the voltage at the positive output of the loading terminal V$_{op}$ is obtained through the voltage at the positive output of the amplifier V$_{ap}$. The voltage at the positive output of the loading terminal V$_{op}$ is expressed in Equation 19.

$$V_{op} = \frac{50}{60+50} \times V_{ap} = \frac{5}{11} \times V_{ap} = \frac{10}{11} \times Tx^+ \quad \text{(Equation 19)}$$

Then, the voltage at the positive measurement end V$_{hp}$ is obtained through the voltage at the positive output of the loading terminal V$_{op}$. The voltage at the positive measurement end V$_{hp}$ is expressed in Equation 20.

$$V_{hp} = \frac{1}{3} \times V_{an} + \frac{2}{3} \times V_{op} = \frac{2Tx^-}{3} + \frac{2}{3} \times \frac{10}{11} Tx^+ = \frac{2}{33} \times Tx^- \quad \text{(Equation 20)}$$

Since the common bias voltage V$_{cm}$ is the basic voltage (reference level) at which the communication apparatus operates, the common bias voltage V$_{cm}$ can be regarded as 0.

$$V_{hp} - V_{cm} = V_{hp} - 0 = \frac{2}{33} \times Tx^- \neq 0 \quad \text{(Equation 21)}$$

Thus, the measurement circuit can obtain the positive voltage difference (V$_{hp}$−V$_{cm}$) corresponding to the 60Ω positive measurement resistance R$_{sp}$.

Likewise, when the positive measurement resistance R$_{sp}$ is equivalent to 50Ω, its corresponding positive voltage difference (V$_{hp}$−V$_{cm}$) can be obtained. The positive voltage difference (V$_{hp}$−V$_{cm}$) corresponding to the 50Ω positive measurement resistance R$_{sp}$ is expressed in Equation 22.

$$V_{hp} - V_{cm} = \quad \text{(Equation 22)}$$
$$V_{hp} - 0 = \frac{1}{3} \times V_{an} + \frac{2}{3} \times V_{op} = \frac{2Tx^-}{3} + \frac{2Tx^+}{3} = 0$$

When the positive measurement resistance R$_{sp}$ is equivalent to 40Ω, is its corresponding positive voltage difference ($V_{hp}-V_{cm}$) is obtained. The positive voltage difference ($V_{hp}-V_{cm}$) corresponding to the 40Ω positive measurement resistance $R_{sp}$ is expressed in Equation 23.

$$V_{hp} - V_{cm} = V_{hp} - 0 = \frac{1}{3} \times V_{an} + \frac{2}{3} \times V_{op} = \frac{-2}{27} \times Tx^- \neq 0 \quad \text{(Equation 23)}$$

When the positive measurement resistance $R_{sp}$ is equivalent to 30Ω, its corresponding positive voltage difference ($V_{hp}-V_{cm}$) is obtained. The positive voltage difference ($V_{hp}-V_{cm}$) corresponding to the 30Ω positive measurement resistance $R_{sp}$ is expressed in Equation 24.

$$V_{hp} - V_{cm} = V_{hp} - 0 = \frac{1}{3} \times V_{an} + \frac{2}{3} \times V_{op} = \frac{-1}{6} \times Tx^- \neq 0 \quad \text{(Equation 24)}$$

Whenever magnitude of the positive measurement resistance $R_{sp}$ changes, positive voltage difference ($V_{hp}-V_{cm}$) is measured accordingly. It can be seen from FIG. 5B that the positive voltage difference ($V_{hp}-V_{cm}$) diminishes as the magnitude of the positive measurement resistance $R_{sp}$ gets closer to the actual magnitude of the positive loading resistance $R_{Lp}$.

Thus, given that actual magnitude of the positive loading resistance $R_{Lp}$ is unknown, the positive measurement resistance $R_{sp}$ is tested with different magnitudes, and a plurality of positive voltage differences ($V_{hp}-V_{cm}$) are correspondingly measured. Among the plurality of measured positive voltage differences ($V_{hp}-V_{cm}$), the minimum one is selected. The selected positive voltage difference ($V_{hp}-V_{cm}$) is close to 0 or equivalent to 0. Then, the positive measurement resistance $R_{sp}$ corresponding to the selected positive voltage difference ($V_{hp}-V_{cm}$) is judged to be equivalent to the actual magnitude of the positive loading resistance $R_{Lp}$.

It is assumed that the positive measurement resistance $R_{sp}$ is within an adjustable range of 30 Ω to 70Ω, and with a predefined adjusting scale. The plurality of positive voltage difference ($V_{hp}-V_{cm}$) corresponding to the plurality of the positive measurement resistance $R_{sp}$ with various magnitudes ranging from 30Ω to 70Ω are measured.

Once a positive voltage differences ($V_{hp}-V_{cm}$) is relatively close to or equivalent to 0, it implies that the voltage at the positive measurement end $V_{hp}$ is equivalent to the common bias voltage $V_{cm}$.

According to the above descriptions, when the voltage at the positive measurement end $V_{hp}$ is equivalent to the common bias voltage $V_{cm}$, the positive loading resistance $R_{Lp}$ is equivalent to the positive measurement resistance $R_{sp}$. Thus, if the positive voltage differences ($V_{hp}-V_{cm}$) is close or equivalent to 0, and the corresponding positive measurement resistance $R_{sp}$ is 50Ω, then it can be judged that the current positive loading resistance $R_{Lp}$ is 50Ω.

During the estimation process, the adjustable range and precision of the adjusting scale of positive measurement resistance $R_{sp}$ can be changed. The adjustment of the range and precision is known by anyone who is skilled in the technology field of the invention, and the similarities are not repeated here.

For example, the range of estimated magnitude of the adjustable positive measurement resistance $R_{sp}$ can be between 40Ω and 60Ω, or between 30Ω and 70Ω. Precision of the adjusting scale of the positive measurement resistance $R_{sp}$ can be set as 0.2Ω, 0.5Ω etc. The positive voltage difference ($V_{hp}-V_{cm}$) corresponding to each of the plurality of positive measurement resistances $R_{sp}$ is measured accordingly.

The positive voltage difference ($V_{hp}-V_{cm}$) is determined by the positive measurement resistance $R_{sp}$ and the positive loading resistance $R_{Lp}$. As magnitude of the positive measurement resistance $R_{sp}$ is already known, the measurement circuit may indirectly judge the magnitude of the positive loading resistance $R_{Lp}$ according to the measured positive voltage difference ($V_{hp}-V_{cm}$). More details about the determination of the positive loading resistance $R_{Lp}$ are discussed as following.

When the positive voltage difference ($V_{hp}-V_{cm}$) is equivalent to 0, the equation $V_{hp}=Rx^+=V_{cm}$ is established. Therefore, the voltage at the positive measurement end $V_{hp}$ is expressed in Equation 25.

$$V_{hp} = Rx^+ = \left(\frac{1}{3}V_{an} + \frac{2}{3}V_{op}\right) \quad \text{(Equation 25)}$$

Wherein $$V_{an} = V_{cm} + 2Tx^- \quad \text{(Equation 26)}$$

$$V_{op} = \left(\frac{R_{Lp}}{R_{Lp}+R_{sp}} \cdot 2Tx^+ + V_{cm}\right) \quad \text{(Equation 27)}$$

Thus, the voltage at the positive measurement end $V_{hp}$ can be further conducted as in Equation 28.

$$\begin{aligned} V_{hp} &= Rx^+ \\ &= \left(\frac{1}{3}V_{an} + \frac{2}{3}V_{op}\right) \\ &= \frac{1}{3}(V_{cm}+2Tx^-) + \frac{2}{3}\left(\frac{R_{Lp}}{R_{Lp}+R_{sp}} \cdot 2Tx^+ + V_{cm}\right) \\ &= V_{cm} + \frac{2}{3}Tx^- + \frac{2}{3}\left(\frac{R_{Lp}}{R_{Lp}+R_{sp}} \cdot 2Tx^+\right) \end{aligned} \quad \text{(Equation 28)}$$

When the positive measurement resistance $R_{sp}$ and the positive loading resistance $R_{Lp}$ are equivalent, the equation of $V_{hp}=Rx^+=V_{cm}$ is established.

$$\frac{2}{3}Tx^- + \frac{2}{3}\left(\frac{R_{Lp}}{R_{Lp}+R_{sp}} \cdot 2Tx^+\right) = 0 \quad \text{(Equation 29)}$$

$$\frac{R_{Lp}}{R_{Lp}+R_{sp}} \cdot 2 = 1$$

When the voltage at the positive measurement end $V_{hp}$ and the common bias voltage $V_{cm}$ are equivalent, magnitudes of the positive loading resistance $R_{Lp}$ and the positive measurement resistance $R_{sp}$ must satisfy Equation 30.

$$\frac{R_{Lp}}{R_{Lp}+R_{sp}} \cdot \frac{1}{2} \quad \text{(Equation 30)}$$

That is, the positive loading resistance $R_{Lp}$ is equivalent to the positive measurement resistance $R_{sp}$.

With reference to FIGS. 5A, and 5B, the estimation process of the positive loading resistance $R_{Lp}$ can be summarized below.

Figure 6:
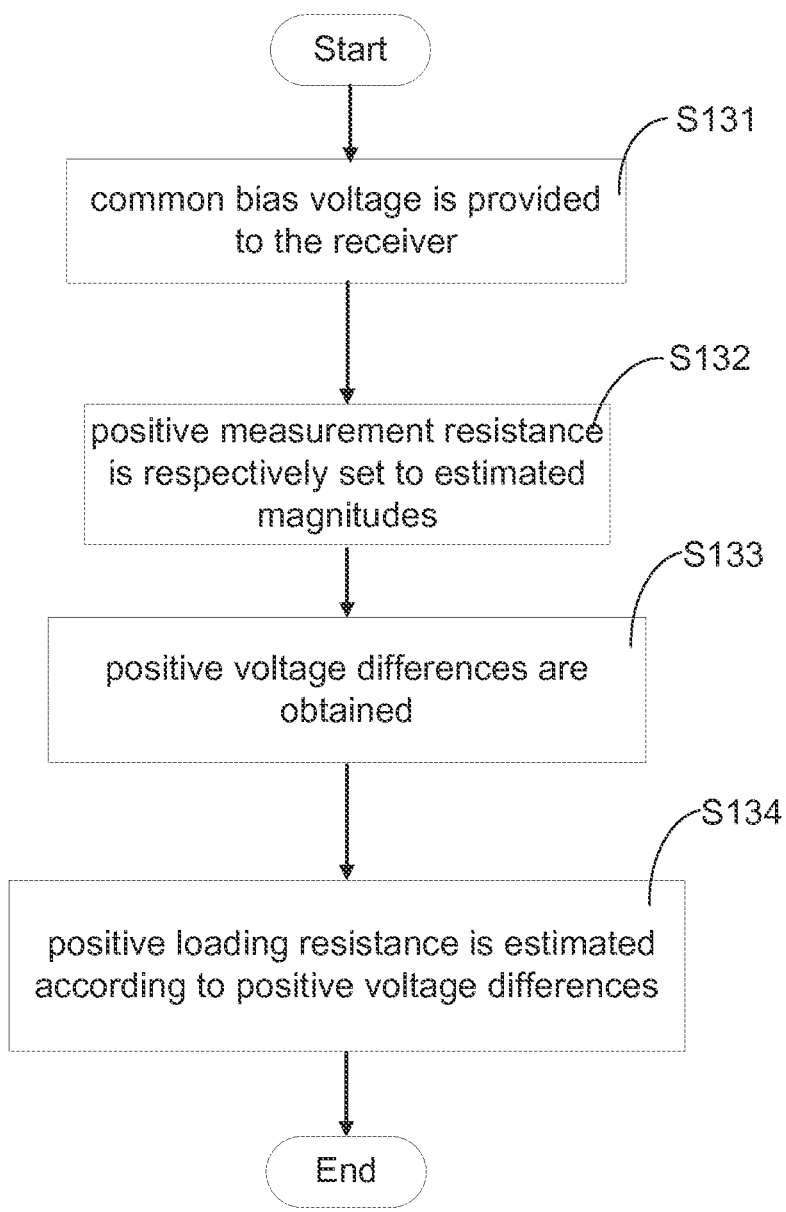
FIG. 6 shows a flowchart of estimating the positive loading resistance $R_{Lp}$.

FIG. 6 shows a flowchart of estimating the actual positive loading resistance $R_{Lp}$.

During the estimation process, a common bias voltage is provided to the receiver 503 (step S131). The positive measurement resistance $R_{sp}$ is respectively set to a plurality of estimated magnitudes (step S132). Correspondingly, a plurality of positive voltage differences ($V_{hp}$-$V_{cm}$) are measured. The measured plurality of positive voltage differences represent the voltage differences between the common bias voltage and the positive measurement end being measured in response to each of the plurality of estimated magnitudes. (step S133). By comparing the plurality of measured positive voltage differences ($V_{hp}$-$V_{cm}$), the positive loading resistance is estimated accordingly (step S134).

In step S134, the minimum of the plurality of positive voltage differences is firstly retrieved. Then, the magnitude of the positive loading resistance is judged as the positive measurement resistance $R_{sp}$ corresponding to the minimum of the plurality of positive voltage differences ($V_{hp}$-$V_{cm}$).

Figure 7:
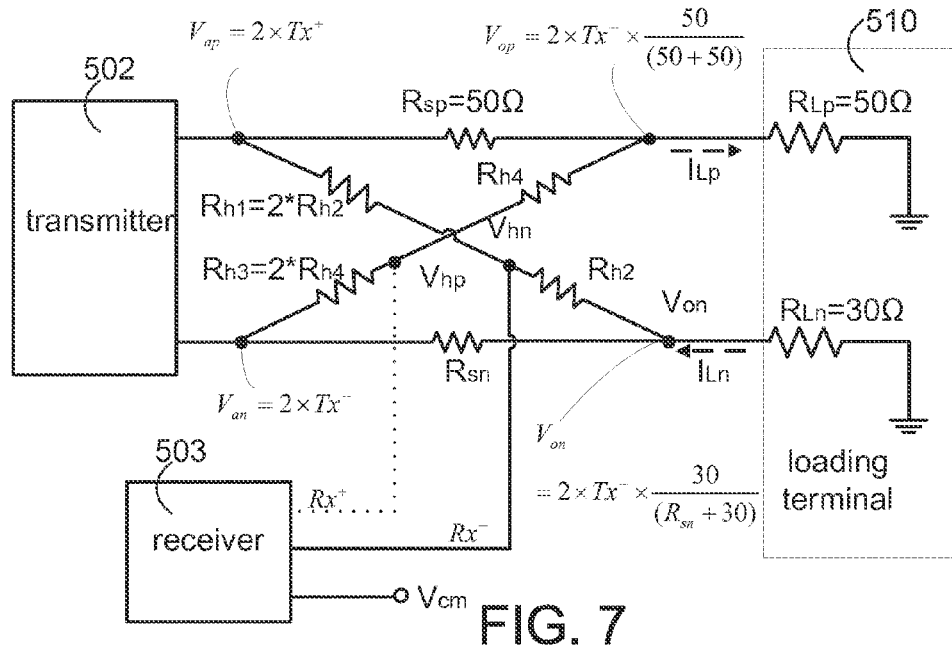
FIG. 7 shows a schematic diagram illustrating how the negative loading resistance $R_{Ln}$ is estimated by an adjustable negative measurement resistance $R_{sn}$ according to the concept of the invention.

FIG. 7 is a schematic diagram illustrating how the negative loading resistance $R_{Ln}$ is estimated by an adjustable negative measurement resistance $R_{sn}$ according to the concept of the present invention.

Like the process illustrated in FIG. 5A, the negative measurement resistance $R_{sn}$ is adjusted through a plurality of estimated magnitudes. The actual negative loading resistance $R_{Ln}$ can be estimated by the adjustable negative measurement resistance $R_{sn}$. That is, the minimum of the plurality of negative voltage differences ($V_{hn}$-$V_{cm}$) is close to or equivalent to 0 ($V_{hn}$-$V_{cm}$≈0, or $V_{hn}$-$V_{cm}$=0). Meanwhile, the magnitude of the negative measurement resistance $R_{sn}$ corresponding to the minimum of the plurality of negative voltage differences ($V_{hn}$-$V_{cm}$) may represent the magnitude of the actual negative loading resistance $R_{Ln}$.

When the negative voltage difference is equivalent to 0 ($V_{hn}$-$V_{cm}$=0), this implies the equation of $V_{hn}$=Rx-=$V_{cm}$ is established. Likewise, when the voltage at the negative measurement end $V_{hn}$ and the common bias voltage $V_{cm}$ are equivalent the negative loading resistance $R_{Ln}$ and the negative measurement resistance $R_{sn}$ will satisfy the following equation.

$$\frac{R_{Ln}}{R_{Ln}+R_{sn}} = \frac{1}{2} \qquad \text{(Equation 31)}$$

In order to satisfy Equation 31, the negative loading resistance $R_{Ln}$ must be equivalent to the negative measurement resistance $R_{sn}$.

Each time when the negative measurement resistance $R_{sn}$ changes, the negative voltage difference ($V_{hn}$-$V_{cm}$) is correspondingly measured. In FIG. 7, when the negative measurement resistance $R_{sn}$ is equivalent to 30Ω, the negative voltage difference ($V_{hn}$-$V_{cm}$) is equivalent to 0. Thus, the negative loading resistance $R_{Ln}$ can be estimated as 30Ω. This process is similar to the process illustrated in FIGS. 5A, 5B, and 6, and can be obtained by analogy; hence the details are not repeated here for simplicity.

Based on the above disclosure, the measurement circuit compares the common bias voltage $V_{cm}$ with the voltage at the positive measurement end $V_{hp}$ or the voltage at the negative measurement end $V_{hn}$ to respectively estimate magnitude of the positive or the negative loading resistance.

After the plurality of positive voltage differences ($V_{hp}$-$V_{cm}$) are measured, the positive loading resistance $R_{Lp}$ is correspondingly estimated. After the plurality of the negative voltage differences ($V_{hp}$-$V_{cm}$) are measured, the negative loading resistance $R_{Ln}$ is correspondingly estimated.

In the above embodiment, the positive loading resistance $R_{Lp}$ is assumed to be 50Ω (ideal magnitude as defined in the specification), and only the negative loading resistance $R_{Ln}$ is assumed to be 30Ω. Both the positive and negative loading resistance may vary in practical applications. Hence, both the positive and the negative loading resistance ($R_{Lp}$ and $R_{Ln}$) will be estimated separately.

Therefore, even when none of the positive and the negative loading resistance ($R_{Lp}$ and $R_{Ln}$) is ideal, the actual magnitudes of the positive and negative loading resistance ($R_{Lp}$ and $R_{Ln}$) can still be estimated.

The estimation of the positive and the negative loading resistance is disclosed with above diagrams. Detailed descriptions for eliminating EMI and echo phenomenon of a communication apparatus by adjusting resistance settings are disclosed below.

After it is determined that the positive loading resistance $R_{Lp}$ is equivalent to 50Ω, and the negative loading resistance $R_{Ln}$ is equivalent to 30Ω, resistance settings of the communication apparatus are adjusted. Descriptions of FIGS. 8, 9, and 10 disclose more details about the adjusting process. However, the present invention is not limited to these embodiments.

Figure 8:
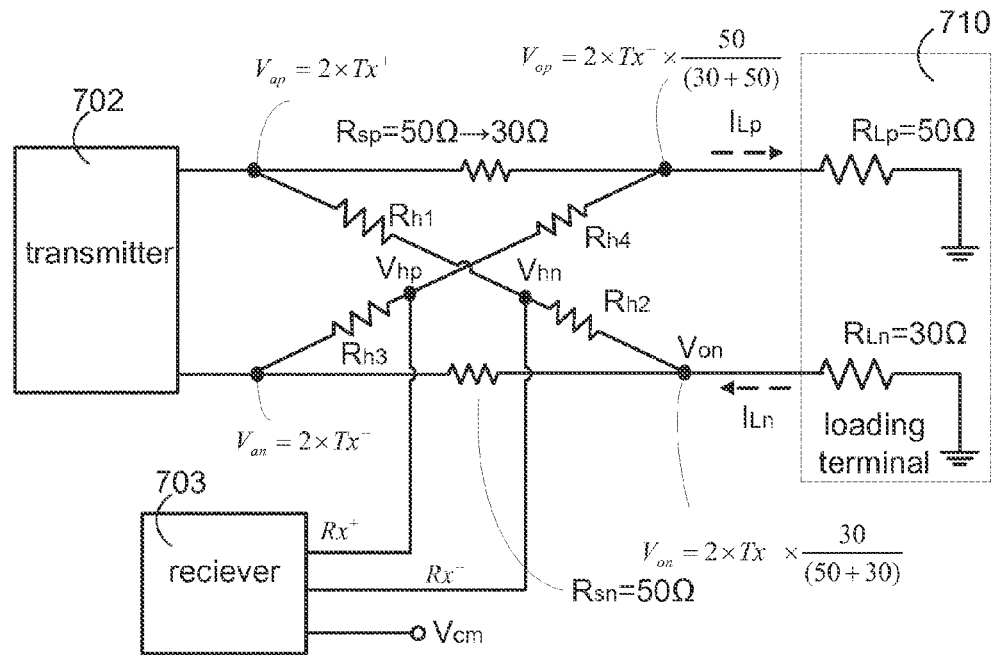
FIG. 8 shows a schematic diagram illustrating a design of eliminating EMI and echo phenomenon by adjusting resistance settings of the connector based on the estimated loading resistances.

FIG. 8 is a schematic illustrating a design of eliminating EMI and echo phenomenon by adjusting resistance settings of the connector based on the estimated loading resistances. In FIG. 8, the depositions of transmitter 702, the receiver 703, the loading terminal 710, and the connector (including the measurement circuit, the bridging circuit) are similar to the ones in previous diagrams, and the similarities are not repeated.

According to an embodiment of the invention, the measurement circuit adjusts magnitudes of the resistances in the measurement circuit according to the estimated positive and negative loading resistance ($R_{Lp}$ and $R_{Ln}$).

Furthermore, the measurement circuit adjusts the magnitude of the negative measurement resistance $R_{sn}$ according to the estimated positive loading resistance $R_{Lp}$ (50Ω). That is, to adjust the negative measurement resistance $R_{sn}$ to be equivalent to the positive loading resistance $R_{Lp}$ ($R_{sn}$=$R_{Lp}$=50Ω). Similarly, the measurement circuit also adjusts the positive measurement resistance $R_{sp}$ according to the estimated negative loading resistance $R_{Ln}$ (30Ω). That is, to adjust the positive measurement resistance $R_{sp}$ to be equivalent to the negative loading resistance ($R_{sp}$=$R_{Ln}$=30Ω)

According to an exemplary embodiment, detail descriptions about how the EMI and echo phenomenon are verified to be eliminated through the calculation of currents and voltages are disclosed below.

(Step 1) The voltage at the positive output of the loading terminal $V_{op}$ can be obtained according to the voltage at the positive output of the amplifier $V_{ap}$ and a resistive divider composed of the positive measurement resistance $R_{sp}$ and the positive loading resistance $R_{Lp}$. The voltage at the positive output of the loading terminal $V_{op}$ is expressed in Equation 32.

$$V_{op} = V_{ap} \times \frac{R_{Lp}}{(R_{Lp}+R_{sp})} \qquad \text{(Equation 32)}$$

-continued $$= 2Tx^+ \times \frac{50}{(50+30)}$$

$$= \frac{5}{4} \times Tx^+$$

(Step 2) The positive loading current $I_{Lp}$ can be obtained according to Equation 32 and the positive loading resistance $R_{Lp}$. The positive loading current $I_{Lp}$ is expressed in Equation 33.

$$I_{Lp} = \frac{V_{op}}{R_{Lp}} = \frac{5}{4} \times Tx^+ \times \frac{1}{50} = \frac{1}{40} \times Tx^+ \quad \text{(Equation 33)}$$

(Step 3) According to the voltage at the negative output of the amplifier $V_{an}$ and a resistive divider composed of the negative measurement resistance $R_{sn}$ and the negative loading resistance $R_{Ln}$, the voltage at the negative output of the loading terminal $V_{on}$ can be obtained. The negative output of the loading terminal $V_{on}$ is expressed in Equation 34.

$$V_{on} = V_{an} \times \frac{R_{Ln}}{(R_{Ln} + R_{sn})} \quad \text{(Equation 34)}$$

$$= 2Tx^- \times \frac{30}{(30+50)}$$

$$= \frac{3}{4} \times Tx^-$$

(Step 4). The negative loading current $I_{Ln}$ can be obtained according to Equation 34 and the negative loading resistance $R_{Ln}$. The negative loading current $I_{Ln}$ is expressed in Equation 35.

$$I_{Ln} = \frac{V_{on}}{R_{Ln}} = \frac{3}{4} \times Tx^- \times \frac{1}{30} = \frac{1}{40} \times Tx^- \quad \text{(Equation 35)}$$

(Step 5) The magnitudes of the positive and the negative loading current ($I_{Lp}$ and $I_{Ln}$) are compared.

As indicated in Equation 33 and Equation 35, when the communication apparatus adopts the above resistance disposition, the positive and the negative loading current ($I_{Lp}$ and $I_{Ln}$) are equivalent. Meanwhile, no EMI phenomenon is generated.

(Step 6) The voltage at the positive measurement end $V_{hp}$ represents the positive reception signal $Rx^+$ received by the receiver 703. The voltage at the positive measurement end $V_{hp}$ can be obtained according to proportion between the third and the fourth bridging resistance ($R_{h3}$ and $R_{h4}$). The voltage at the positive measurement end $V_{hp}$ is expressed in Equation 36.

$$V_{hp} = R_{Lp} \quad \text{(Equation 36)}$$

$$= \left(\frac{1}{3}V_{an} + \frac{2}{3}V_{op}\right)$$

$$= \frac{1}{3}(2 \times Tx^-) + \frac{2}{3}\left(\frac{3}{4} \times Tx^+\right)$$

$$= \frac{2}{3} \times Tx^- + \frac{1}{2} \times Tx^+$$

$$= \frac{1}{6}Tx^-$$

(Step 7) The voltage at the negative measurement end $V_{hn}$ represents the negative reception signal $Rx^-$ received by the receiver 703. The voltage at the negative measurement end $V_{hn}$ can be obtained according to proportion between the first and the second bridging resistance ($R_{h1}$ and $R_{h2}$). The voltage at the negative measurement end $V_{hn}$ is expressed in Equation 37.

$$V_{hn} = R_{Ln} \quad \text{(Equation 37)}$$

$$= \left(\frac{1}{3}V_{ap} + \frac{2}{3}V_{on}\right)$$

$$= \frac{1}{3}(2Tx^+) + \frac{2}{3}\left(\frac{3}{4} \times Tx^-\right)$$

$$= \left(\frac{2}{3} \times Tx^+ + \frac{1}{2} \times Tx^-\right)$$

$$= \frac{1}{6} \times Tx^+$$

(Step 8) The voltages at the positive and the negative measurement end ($V_{hp}$ and $V_{hn}$) are compared. According to Equation 36 and Equation 37, the voltages at the positive and the negative measurer measurement end are equivalent ($V_{hp} = V_{hn}$). Thus, the design of FIG. 7 also eliminates echo phenomenon.

In addition to adjusting resistance settings of the connector, problems caused by EMI and echo phenomenon can also be largely eliminated by adjusting the magnitudes of the resistances of the transmitter.

Figure 9:
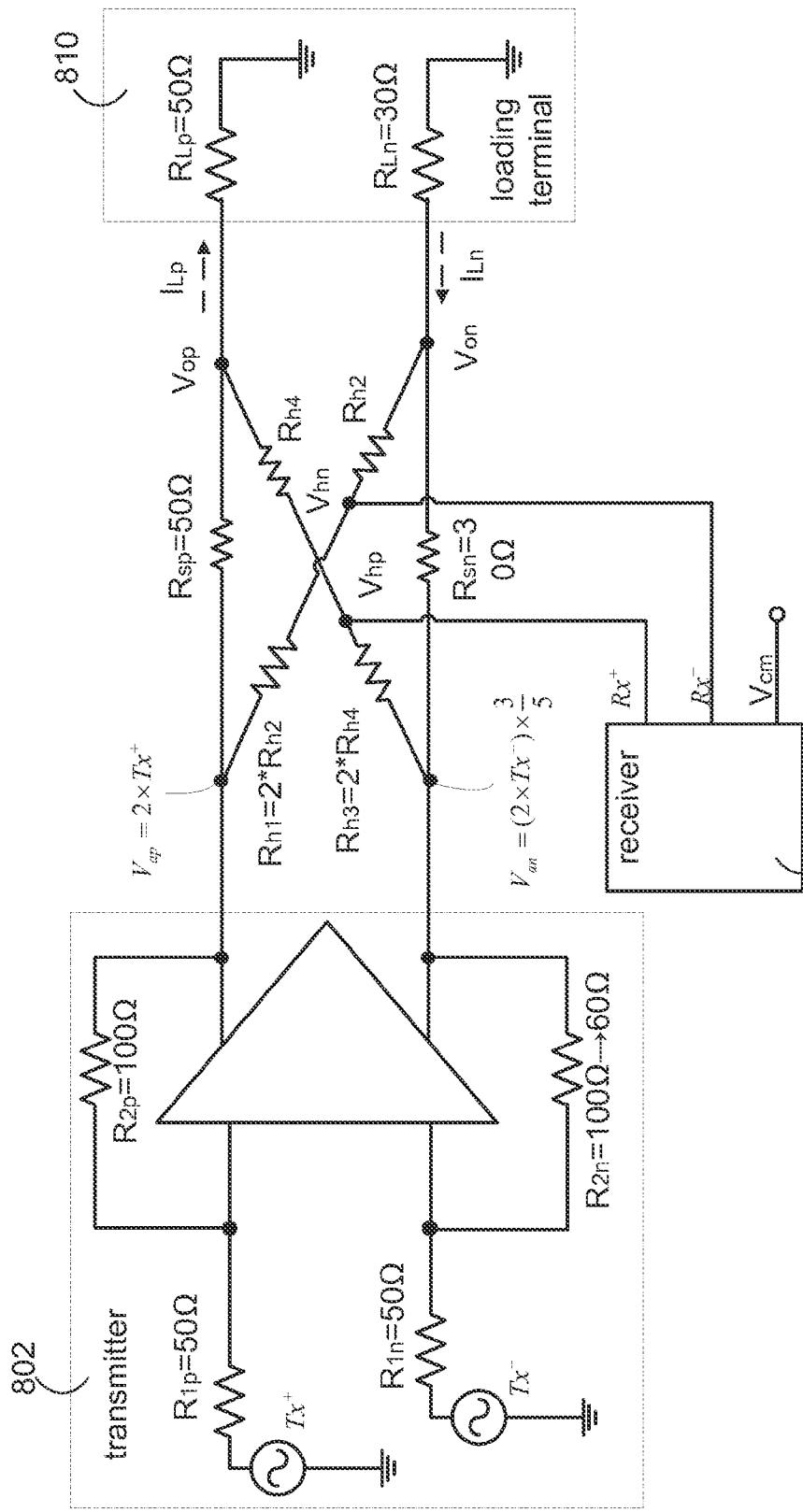
FIG. 9 shows a schematic diagram illustrating a design for eliminating EMI and echo phenomenon by adjusting resistance settings of a transmitter according to an estimation result of resistance at a loading terminal.

FIG. 9 is a schematic diagram illustrating a design for eliminating EMI and echo phenomenon according to the present invention. By adjusting resistance settings of a transmitter according to estimation result of loading resistances, both EMI and echo phenomenon are eliminated. In FIG. 9, the transmitter 802, the receiver 803, the loading terminal 810, and the connector (including the measurement circuit, and the bridging circuit) are similar to corresponding elements of previous diagrams, and the similarities are not repeated.

In the present embodiment, the first resistances at the positive source and the negative sources ($R_{1p}$ and $R_{1n}$) are assumed to be fixed. In addition, the second resistances at the positive and the negative source ($R_{2p}$ and $R_{2n}$) can be adjusted according to estimated loading resistances.

For example, the first resistances at the positive source and the negative source ($R_{1p}$ and $R_{1n}$) are both assumed to be 50Ω. On the other hand, the second resistances at the positive source and the negative source ($R_{2p}$ and $R_{2n}$) are both assumed to be 100Ω in the first place. When the estimated positive loading resistance $R_{Lp}$ is equivalent to 50Ω, and the estimated negative loading resistance $R_{Ln}$ is equivalent to 30Ω, the positive loading resistance $R_{Lp}$, the positive measurement resistance $R_{sp}$, the second resistances at the positive source and the negative source ($R_{2p}$ and $R_{2n}$) are correspondingly adjusted.

Firstly, the estimated positive loading resistance $R_{Lp}$ is used to set the positive measurement resistance $R_{sp}$. That is, the positive measurement resistance $R_{sp}$ is set to be equivalent to the estimated positive loading resistance $R_{Lp}$. The estimated negative loading resistance $R_{Ln}$ is used to set the negative measurement resistance $R_{sn}$. That is, the negative measurement resistance $R_{sn}$ is set to be equivalent to the estimated negative loading resistance $R_{Ln}$.

Secondly, the settings of the second resistances at the positive source and the negative source ($R_{2p}$ and $R_{2n}$) are adjusted so that the ratio ($R_{Lp}/R_{Ln}$) of the positive loading resistance $R_{Lp}$ to the negative loading resistance $R_{Ln}$ is equivalent to the ratio ($R_{2p}/R_{2n}$) of the second resistances at the positive source and the negative source ($R_{2p}$ and $R_{2n}$).

Through the calculation of currents and voltages, EMI and echo phenomenon are proved to be eliminated. Detailed descriptions are disclosed below.

(Step 1) The voltage at the positive output of the amplifier $V_{ap}$ is obtained first. Then, according to the voltage at the positive output of the amplifier $V_{ap}$ and a resistive divider composed of the positive loading resistance $R_{Lp}$ and the positive measurement resistance $R_{sp}$, the voltage at the positive output of the loading terminal $V_{op}$ can be obtained.

$$V_{ap} = Tx^+ \times \frac{100}{50} = 2Tx^+ \qquad \text{(Equation 38)}$$

$$V_{op} = V_{ap} \times \frac{R_{Lp}}{(R_{Lp} + R_{sp})} \qquad \text{(Equation 39)}$$
$$= 2Tx^+ \times \frac{50}{(50+50)}$$
$$= Tx^+$$

(Step 2) The positive loading current $I_{Lp}$ can be obtained according to Equation 39 and the positive loading resistance $R_{Lp}$. The positive loading current $I_{Lp}$ is expressed in Equation 40.

$$I_{Lp} = \frac{V_{op}}{R_{Lp}} = Tx^+ \times \frac{1}{50} \qquad \text{(Equation 40)}$$

(Step 3) The voltage at the negative output of the amplifier $V_{an}$ is obtained. Then, according to the voltage at the negative output of the amplifier $V_{an}$ and a resistive divider composed of the negative measurement resistance $R_{sn}$ and the negative loading resistance $R_{Ln}$, the voltage at the negative output of the loading terminal $V_{on}$ can be obtained.

$$V_{an} = Tx^- \times \frac{60}{50} = \frac{6}{5} \times Tx^- \qquad \text{(Equation 41)}$$

$$V_{on} = V_{an} \times \frac{R_{Ln}}{(R_{Ln} + R_{sn})} \qquad \text{(Equation 42)}$$
$$= \frac{6}{5} \times Tx^- \times \frac{30}{(30+30)}$$
$$= \frac{3}{5} \times Tx^-$$

(Step 4) The negative loading current $I_{Ln}$ can be obtained according to Equation 42 and the negative loading resistance $R_{Ln}$. The negative loading current $I_{Ln}$ is expressed in Equation 43.

$$I_{Ln} = \frac{V_{on}}{R_{Ln}} = \frac{3}{5} \times Tx^- \times \frac{1}{30} = \frac{1}{50} \times Tx^- \qquad \text{(Equation 43)}$$

(Step 5) The magnitudes of the positive and the negative loading current ($I_{Lp}$ and $I_{Ln}$) are compared.

As indicated in Equation 40, and Equation 43, when the communication apparatus adopts the above disposition of resistances, the positive and negative loading current are equivalent ($I_{Lp}=I_{Ln}$). Hence, no EMI phenomenon will occur.

(Step 6) The voltage at the positive measurement end $V_{hp}$ can be obtained according to proportion between the third and the fourth bridging resistance ($R_{h3}$ and $R_{h4}$). The voltage at the positive measurement end $V_{hp}$ is expressed in Equation 44.

$$V_{hp} = R^+ \qquad \text{(Equation 44)}$$
$$= \left(\frac{1}{3}V_{an} + \frac{2}{3}V_{op}\right)$$
$$= \frac{1}{3}\left(\frac{6}{5} \times Tx^-\right) + \frac{2}{3}(Tx^+)$$
$$= \frac{2}{5}Tx^- + \frac{2}{3}Tx^+$$
$$= \frac{4}{15}Tx^+$$

(Step 7) The voltage at the negative measurement end $V_{hn}$ can be obtained according to proportion between the first and the second bridging resistance ($R_{h1}$ and $R_{h2}$). The voltage at the negative measurement end $V_{hn}$ is expressed in Equation 45.

$$V_{hn} = R^- \qquad \text{(Equation 45)}$$
$$= \left(\frac{1}{3}V_{ap} + \frac{2}{3}V_{on}\right)$$
$$= \frac{1}{3}(2Tx^+) + \frac{2}{3}\left(\frac{3}{5} \times Tx^-\right)$$
$$= \left(\frac{2}{3} \times Tx^+ + \frac{2}{5} \times Tx^-\right)$$
$$= \frac{4}{15} \times Tx^+$$

(Step 8) The voltages at the positive and the measurement ends ($V_{hp}$ and $V_{hn}$) are compared. According to Equation 44, and Equation 45, the equation of $V_{hp}=V_{hn}$ is established. Thus, the design of FIG. 7 also eliminates echo phenomenon.

As disclosed in this embodiment, EMI and echo phenomenon of the communication apparatus are eliminated by adjusting the second resistances at the positive source and the negative source ($R_{2p}$ and $R_{2n}$). With the adjustment, the resistances satisfy the equation of $$\frac{R_{2P}}{R_{2n}} = \frac{R_{LP}}{R_{Ln}}.$$

Figure 10:
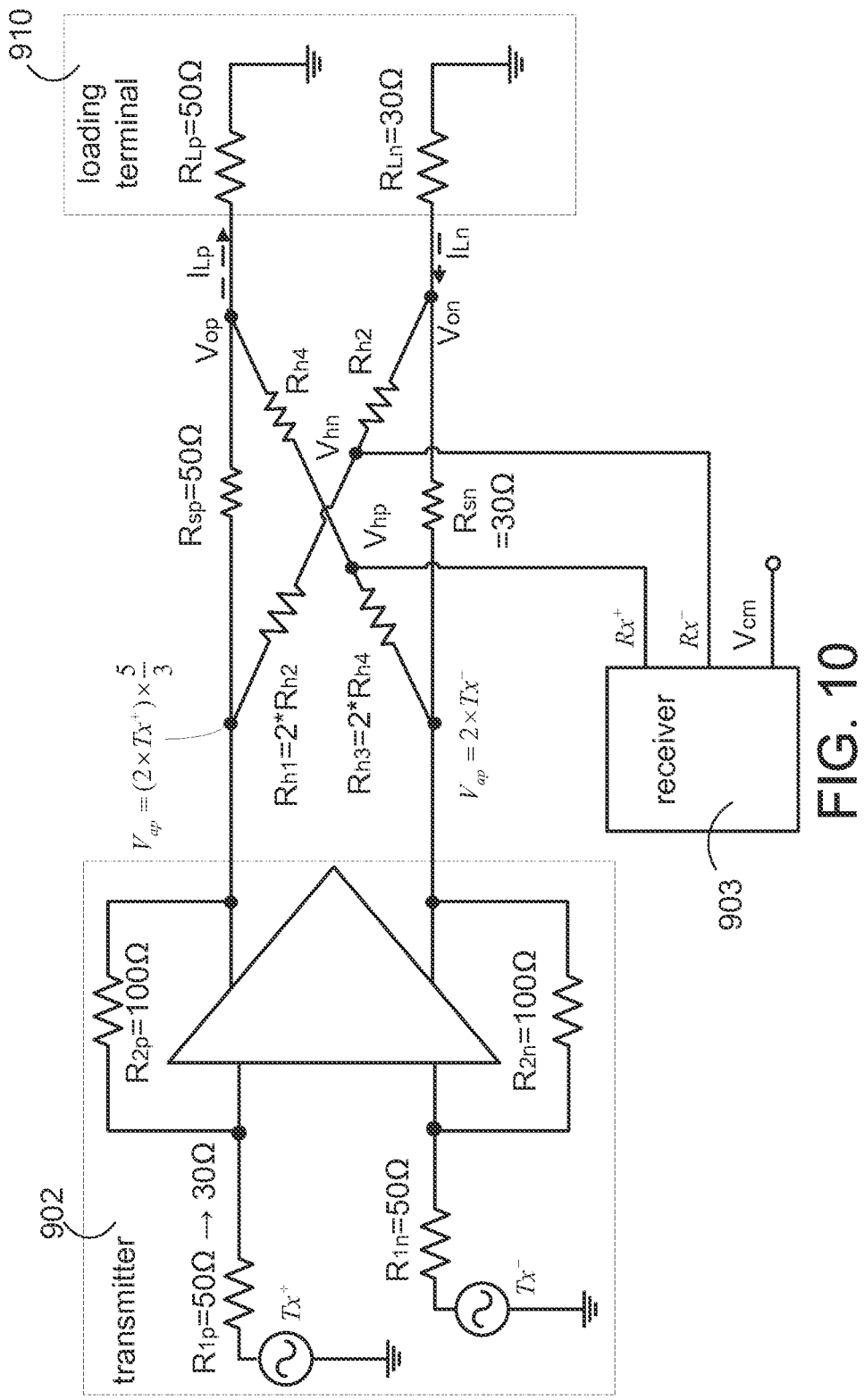
FIG. 10 shows a schematic diagram illustrating another design for eliminating EMI and echo phenomenon by adjusting resistance settings of a transmitter according to an estimation result of resistance at a loading terminal; and, FIG. 11 shows a flowchart for eliminating EMI and echo phenomenon by estimating the positive and the negative loading resistance and adjusting resistance settings of a communication apparatus.

FIG. 10 is a schematic diagram illustrating another design for eliminating EMI and echo phenomenon according to the invention. By adjusting resistance settings of a transmitter according to estimated positive/negative loading resistances of the loading terminal, both EMI and echo phenomenon are proved to be eliminated. In FIG. 10, the transmitter 902, the receiver 903, the loading terminal 910 and the connector (includes the measurement circuit, the bridging circuit) are similar to the ones in the previous diagrams, and the similarities are not repeated In the present embodiment, the first resistances at the positive source and the negative source ($R_{1p}$ and $R_{1n}$) can be adjusted according to estimated loading resistances. And, the second resistances at the positive source and the negative source ($R_{2p}$ and $R_{2n}$) are assumed to be fixed.

For example, the first resistances at the positive source and the negative source ($R_{1p}$ and $R_{1n}$) are both assumed to be equivalent to 50Ω. On the other hand, the second resistances at the positive source and the negative source ($R_{2p}$ and $R_{2n}$) are both equivalent to 100Ω in the first place.

When the estimated positive loading resistance $R_{Lp}$ is equivalent to 50Ω, and the estimated negative loading resistance $R_{Ln}$ is equivalent to 30Ω, the positive measurement resistance $R_{sp}$, the first resistances at the positive source and the negative source ($R_{1p}$ and $R_{1n}$) are correspondingly adjusted.

Firstly, the magnitude of the estimated positive loading resistance $R_{Lp}$ is used to set the positive measurement resistance $R_{sp}$, and the estimated negative loading resistance $R_{Ln}$ is used to set the negative measurement resistance $R_{sn}$.

Secondly, the settings of the first resistances at the negative and the positive sources ($R_{1n}$ and $R_{1p}$) are adjusted so that the ratio ($R_{Lp}/R_{Ln}$) of the positive loading resistance $R_{Lp}$ to the negative loading resistance $R_{Ln}$ is equivalent to the ratio ($R_{1n}/R_{1p}$) of the first resistance at the negative source $R_{1n}$ to the first resistance at the positive source $R_{1p}$.

Through the calculation of currents and voltages, it is proved that EMI and echo phenomenon are eliminated according to the above exemplary embodiment. Detailed descriptions are disclosed below.

(Step 1) The voltage at the positive output of the amplifier $V_{ap}$ is obtained first. Then, according to the voltage at the positive output of the amplifier $V_{ap}$, and a resistive divider composed of the positive loading resistance $R_{Lp}$ and the positive measurement resistance $R_{sp}$, the voltage at the positive output of the loading terminal $V_{op}$ can be obtained.

$$V_{ap} = \frac{10}{3} \times Tx^+ \quad \text{(Equation 46)}$$

$$V_{op} = V_{ap} \times \frac{R_{LP}}{(R_{Lp} + R_{sp})} \quad \text{(Equation 47)}$$
$$= \frac{10}{3} \times Tx^+ \times \frac{50}{(50+50)}$$
$$= \frac{5}{3} \times Tx^+$$

(Step 2) The positive loading current $I_{Lp}$ can be obtained according to Equation 47 and the positive loading resistance $R_{Lp}$. The positive loading current $I_{Lp}$ is expressed in Equation 48.

$$I_{Lp} = \frac{V_{op}}{R_{Lp}} = \frac{5}{3} \times Tx^+ \times \frac{1}{50} = \frac{1}{30} \times Tx^+ \quad \text{(Equation 48)}$$

(Step 3) The voltage at the negative output of the amplifier $V_{an}$ is obtained first. Then, according to the voltage at the negative output of the amplifier $V_{an}$ and a resistive divider composed of the negative measurement resistance $R_{sn}$ and the negative loading resistance $R_{Ln}$, the voltage at the negative output of the loading terminal $V_{on}$ can be obtained.

$$V_{an} = Tx^- \times \frac{100}{50} = V_{cm} + 2 \times Tx^- \quad \text{(Equation 49)}$$

$$V_{on} = V_{an} \times \frac{R_{Ln}}{(R_{Ln} + R_{sn})} \quad \text{(Equation 50)}$$
$$= 2Tx^- \times \frac{30}{(30+30)}$$
$$= Tx^-$$

(Step 4) The negative loading current $I_{Ln}$ can be obtained according to Equation 50 and the negative loading resistance $R_{Ln}$. The negative loading current $I_{Ln}$ is expressed in Equation 43.

$$I_{Ln} = \frac{V_{on}}{R_{Ln}} = Tx^- \times \frac{1^-}{30} \quad \text{(Equation 51)}$$

(Step 5) The magnitudes of the positive loading current $I_{Lp}$ and the negative loading current $I_{Ln}$ are compared.

As indicated in Equation 48 and Equation 51, when the communication apparatus adopts the above disposition of resistance settings, the positive and negative loading current ($I_{Lp}$ and $I_{Ln}$) are equivalent ($I_{Lp}=I_{Ln}$). Meanwhile, no EMI phenomenon is generated.

(Step 6) The voltage at the positive measurement end $V_{hp}$ (that is, the positive reception signal $Rx^+$ received by the receiver 903) can be obtained according to proportion between the third and the fourth bridging resistance ($R_{h3}$ and $R_{h4}$). The voltage at the positive measurement end $V_{hp}$ is expressed in Equation 52.

$$V_{hp} = R_x^+ \quad \text{(Equation 52)}$$
$$= \left(\frac{1}{3}V_{an} + \frac{2}{3}V_{op}\right)$$
$$= \frac{1}{3}(2Tx^-) + \frac{2}{3}\left(\frac{1}{2} \times 2 \times Tx^+ \times \frac{5}{3}\right)$$
$$= \frac{2}{3}Tx^- + \frac{10}{9}Tx^+$$
$$= \frac{4}{9}Tx^+$$

(Step 7) The voltage at the negative measurement end $V_{hn}$ (that is, the negative reception signal $Rx^-$ received by the receiver 903) can be obtained according to proportion between the first and the second bridging resistance ($R_{h1}$ and $R_{h2}$). The voltage at the negative measurement end $V_{hn}$ is expressed in Equation 53.

$$V_{hn} = R_x^- \quad \text{(Equation 53)}$$
$$= \left(\frac{1}{3}V_{ap} + \frac{2}{3}V_{on}\right)$$
$$= \frac{1}{3}\left(\frac{10}{3} \times Tx^+\right) + \frac{2}{3}\left(2 \times \frac{1}{2}Tx^-\right)$$
$$= \left(\frac{10}{9}Tx^+\right) + \left(\frac{2}{3} \times Tx^-\right)$$
$$= \frac{4}{9} \times Tx^+$$

(Step 8) The voltages at the positive and the negative measurement end ($V_{hp}$ and $V_{hn}$) are compared. According to Equation 52 and Equation 53, the equation of $V_{hp}=V_{hn}$ is established. Thus, the design of FIG. 7 also eliminates echo phenomenon.

As disclosed in the embodiment of the invention, the positive and negative measurement resistance ($R_{sp}$, $R_{sn}$) and the first resistances at the positive and the negative source ($R_{1p}$ and $R_{1n}$) are adjusted in order to match the equation of $$\frac{R_{1p}}{R_{1n}} = \frac{R_{sp}}{R_{sn}}.$$

By satisfying the equation of $$\frac{R_{1p}}{R_{1n}} = \frac{R_{sp}}{R_{sn}},$$

both EMI and echo phenomenon of the communication apparatus are eliminated.

Descriptions of the embodiments of FIGS. 8, 9, 10 are summarized as follows. By adjusting resistance settings of the communication apparatus, two equations are established. That is, the equation of $I_{Lp}=I_{Ln}$ (the positive loading current $I_{Lp}$ is equivalent to the negative loading current $I_{Ln}$) and the equation of $V_{hp}=V_{hn}$ (the voltages at the positive and the negative measurement end are equivalent) are both established. When the equation of $I_{Lp}=I_{Ln}$ is established, EMI phenomenon can be eliminated. When the equation of $V_{hp}=V_{hn}$ is established, echo phenomenon can be eliminated.

The positive loading current $I_{Lp}$ can be obtained according to the voltage at the positive output of the loading terminal $V_{op}$ and the positive loading resistance $R_{Lp}$. The voltage at the positive output of the loading terminal $V_{op}$ can be obtained according to the voltage at the positive output of the amplifier $V_{ap}$ and a resistive divider composed of the positive measurement resistance $R_{sp}$ and the positive loading resistance $R_{Lp}$.

The second resistance at the positive source $R_{2p}$ is electrically connected to the amplifier, and the first resistance at the positive source $R_{1p}$ is electrically connected to the amplifier and the positive transmission signal Tx+. Thus, the voltage at the positive output of the amplifier $V_{ap}$ can be obtained according to the second and the first resistances at the positive source ($R_{2p}$ and $R_{1p}$). The positive loading current $I_{Lp}$ is expressed in Equation 54.

$$I_{Lp} = \frac{V_{op}}{R_{Lp}} \qquad \text{(Equation 54)}$$
$$= \left[-Tx^+ \times \left(\frac{R_{2p}}{R_{1p}}\right) \times \left(\frac{R_{Lp}}{R_{Lp}+R_{sp}}\right)\right] \times \frac{1}{R_{Lp}}$$
$$= -Tx^+ \times \frac{R_{2p}}{R_{1p}} \times \frac{1}{R_{Lp}+R_{sp}}$$

Similarly, the negative loading current $I_{Ln}$ can be obtained according to the voltages at the negative output of the loading terminal $V_{on}$ and the negative loading resistance $R_{Ln}$. The voltage at the negative output of the loading terminal $V_{on}$ can be obtained according to the voltage at the negative output of the amplifier $V_{an}$ and a resistive divider composed of the negative measurement resistance $R_{sn}$ and the negative loading resistance $R_{Ln}$.

The second resistance at the negative source $R_{2n}$ is electrically connected to the amplifier, and the first resistance at the negative source $R_{1n}$ is electrically connected to the amplifier and the negative transmission signal Tx−. Thus, the voltage at the negative output of the amplifier $V_{an}$ can be obtained according to the second and the first resistances at the negative source ($R_{2n}$ and $R_{1n}$). The negative loading current $I_{Ln}$ is expressed in Equation 55.

$$I_{Ln} = \frac{V_{on}}{R_{Ln}} \qquad \text{(Equation 55)}$$
$$= \left[Tx^+ \times \left(\frac{R_{2n}}{R_{1n}}\right) \times \left(\frac{R_{Ln}}{R_{Ln}+R_{sn}}\right)\right] \times \frac{1}{R_{Ln}}$$
$$= Tx^+ \times \frac{R_{2n}}{R_{1n}} \times \frac{1}{R_{Ln}+R_{sn}}$$

To eliminate EMI phenomenon, Equation 54, and Equation 55 must be equivalent. That is, the magnitudes of the resistances must satisfy Equation 56.

$$\frac{R_{2n}}{R_{1n}} \times \frac{1}{R_{Ln}+R_{sn}} = \frac{R_{2p}}{R_{1p}} \times \frac{1}{R_{Lp}+R_{sp}} \qquad \text{(Equation 56)}$$

On the other hand, it is assumed that resistances in the bridging circuit satisfy the equations of $R_{h1}=2R_{h2}$ and $R_{h3}=2R_{h4}$. The voltage at the positive measurement end $V_{hp}$ (the positive reception signal Rx+) is determined according to proportion between the third and the fourth bridging resistance ($R_{h3}$ and $R_{h4}$). The voltage at the negative measurement end $V_{hn}$ (the negative reception signal Rx−) is determined according to proportion between the first and the second bridging resistance ($R_{h1}$ and $R_{h2}$).

Thus, the voltage difference between the voltages at the positive and the negative measurement end ($V_{hp}$ and $V_{hn}$) is equivalent to 0. Consequently, echo phenomenon is resolved. The voltage difference between the positive and the negative measurement end ($V_{hp}-V_{hn}$) is expressed in Equation 57.

$$V_{hp} - V_{hn} = \left(\frac{1}{3}V_{an} + \frac{2}{3}V_{op}\right) - \left(\frac{1}{3}V_{ap} + \frac{2}{3}V_{on}\right) = 0 \qquad \text{(Equation 57)}$$

It should be noted that when the proportion between the first and the second bridging resistances ($R_{h1}$ and $R_{h2}$), and/or the proportion between the third and the fourth bridging resistances ($R_{h3}$ and $R_{h4}$) changes, Equation 57 needs to be adjusted accordingly. However, the concept of adjusting resistances to satisfy the equation of ($V_{hp}-V_{hn}$)=0 is still held.

Furthermore, the scope of the present invention is not limited the embodiments. For instance, as long as Equation 56, and the equation of ($V_{hp}-V_{hn}$)=0 are both satisfied, resistance being adjusted may vary.

Figure 11:
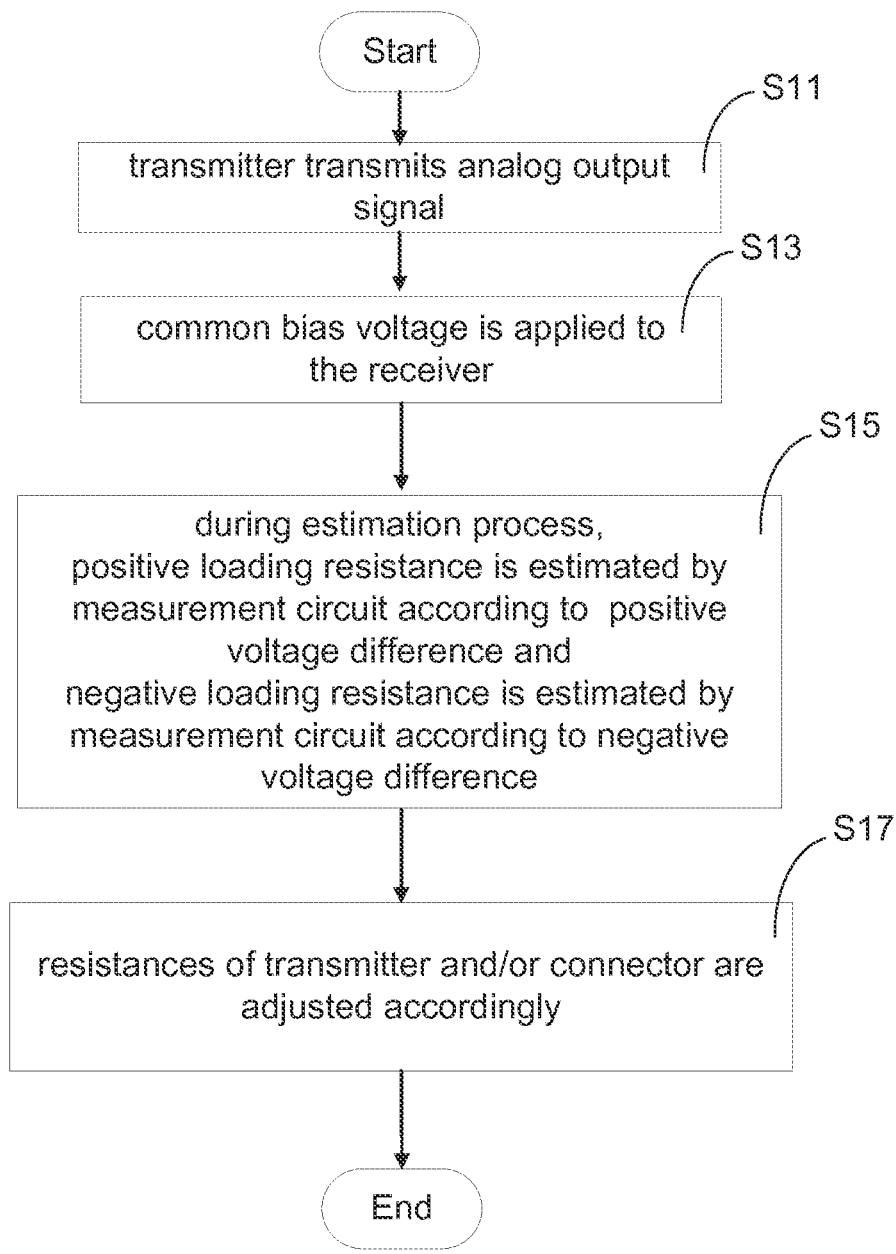

FIG. 11 is a flowchart illustrating a design of eliminating EMI and echo phenomenon by estimating loading resistance, and adjusting resistance settings of a communication apparatus. The estimation and adjustment method of the invention includes following steps.

An analog output signal is transmitted by the transmitter (step S11). A common bias voltage $V_{cm}$ is applied to the receiver (step S13). During the estimation process, the positive loading resistance $R_{Lp}$ corresponding to the loading terminal is estimated by the measurement circuit according to the positive voltage difference ($V_{hp}-V_{cm}$). Similarly, during the estimation process, the negative loading resistance $R_{Ln}$ corresponding to the loading terminal is estimated by the measurement circuit according to the negative voltage difference $(V_{hn}-V_{cm})$ (step S15).

After the estimation process, the estimated positive and the estimated negative loading resistance ($R_{Lp}$ and $R_{Ln}$) are retrieved. Then, the resistances of the transmitter and/or the connector are adjusted accordingly (step S17).

Step S15 further includes one stage of estimating the positive loading resistance $R_{Lp}$, and another stage of estimating the negative loading resistance $R_{Ln}$:

One stage is indicated in FIGS. 5A, 5B, and 6, the positive loading resistance corresponding to the loading terminal $R_{Lp}$ is estimated according to the plurality of measured positive voltage differences $(V_{hp}-V_{cm})$. When the voltage at the positive measurement end $V_{hp}$ is equivalent to the voltage at the common bias voltage $V_{cm}$, the corresponding positive measurement resistance $R_{sp}$ is equivalent to the estimated positive loading resistance $R_{Lp}$.

The other stage is indicated in FIG. 7, the negative loading resistance $R_{Ln}$ of the loading terminal is estimated according to the plurality of measured negative voltage differences $(V_{hn}-V_{cm})$. When the voltage at the negative measurement end $V_{hn}$ is equivalent to the voltage at the common bias voltage $V_{cm}$, the corresponding negative measurement resistance $R_{sn}$ is judged to be equivalent to the estimated negative loading resistance $R_{Ln}$.

Detailed descriptions of step S15 are disclosed in FIGS. 5, 6, and 7, and are not repeated here.

It can be known from the above descriptions that step S17 can be implemented differently. A number of implementations are exemplified below.

In the first embodiment (referring to FIG. 8), step S17 includes following sub-steps. The measurement circuit adjusts the negative measurement resistance $R_{sn}$ according to the estimated positive loading resistance $R_{Lp}$. Then, the measurement circuit adjusts the positive measurement resistance $R_{sp}$ according to the estimated negative loading resistance $R_{Ln}$.

In the second embodiment (referring to FIG. 9), step S17 includes following sub-steps. Set the positive measurement resistance $R_{sp}$ as the estimated positive loading resistance $R_{Lp}$. Set the negative measurement resistance $R_{sn}$ as the estimated negative loading resistance $R_{Ln}$. And, the second resistance at the positive source $R_{2p}$, and the second resistance at the negative source are adjusted such that the ratio of the positive and the negative loading resistance $(R_{Lp}/R_{Ln})$ is equivalent to the ratio of the second resistances at the positive and the negative source $(R_{2p}/R_{2n})$.

In the third embodiment (referring to FIG. 10), step S17 includes following sub-steps. The positive measurement resistance $R_{sp}$ is set as the estimated positive loading resistance $R_{Lp}$. The negative measurement resistance $R_{sn}$ is set as the estimated negative loading resistance $R_{Ln}$. And, the resistances at the first negative and the positive source ($R_{1n}$ and $R_{1p}$) are adjusted such that the ratio of the positive and the negative loading resistances $(R_{Lp}/R_{Ln})$ is equivalent to the ratio of the first resistances at the negative and the positive sources $(R_{1n}/R_{1p})$.

As disclosed above, through the estimation process, the estimated positive and negative loading resistances ($R_{Lp}$ and $R_{Ln}$) are obtained. Then, resistance settings of the communication apparatus are adjusted according to the estimated results. Through adjusting resistance settings, EMI and echo phenomenon are eliminated. Then, when the communication apparatus is in an ordinary data transmission mode, the receiver directly receives the analog input signal via the positive measurement end $V_{hp}$, and the negative measurement end $V_{hn}$.

After the positive and the negative loading resistance ($R_{Lp}$, and $R_{Ln}$) are estimated according to the concept of the invention, EMI and echo phenomenon can be eliminated in response to actual situations of loading. However, the adjustment of resistance settings can be flexibly modified and is not limited to the exemplifications disclosed in above embodiments.

In addition, the embodiments of the present invention are focused on the EMI and echo phenomenon during data transmission. The application of the present invention is not limited to network data transmission. In other words, the invention can also be used in other types of differential communication having EMI and echo phenomenon.

Bases on the high-definition multimedia interface (hereinafter, HDMI) specifications, the current HDMI transmission line uses a wire having good wrapping effect and material quality but does not consider the generation of EMI. However, if EMI can be reduced through product improvement, the cost of HDMI products can also be reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A communication apparatus electrically connected to a loading terminal and operating at a common bias voltage, wherein the communication apparatus comprises:
   a transmitter, for transmitting an analog output signal;
   a connector, comprising:
      a bridging circuit, electrically connected between the transmitter and the loading terminal, having a positive measurement end and a negative measurement end; and
      a measurement circuit, electrically connected between the bridging circuit, the transmitter, and the loading terminal; and
   a receiver, electrically connected to the bridging circuit, for receiving the common bias voltage during an estimation process, wherein, during the estimation process, the measurement circuit estimates a positive loading resistance and a negative loading resistance corresponding to the loading terminal according to a voltage difference between the common bias voltage and voltage at one of the positive measurement end and the negative measurement end.

2. The communication apparatus according to claim 1, wherein the receiver receives an analog input signal through the positive measurement end and the negative measurement end after the estimation process.

3. The communication apparatus according to claim 1, wherein the measurement circuit estimates the positive loading resistance according to a voltage difference between the common bias voltage and the voltage at the positive measurement end, and estimates the negative loading resistance according to a voltage difference between the common bias voltage and the voltage at the negative measurement end.

4. The communication apparatus according to claim 1, wherein the transmitter is electrically connected to the connector through a positive output of an amplifier and a negative output of the amplifier, and the connector is electrically connected to the loading terminal through a positive output of the loading terminal and a negative output of the loading terminal, and the bridging circuit comprises:
- a first bridging path, comprising:
  - a first bridging resistance, electrically connected between the positive output of the amplifier and the negative measurement end; and
  - a second bridging resistance, electrically connected between the negative measurement end and the negative output of the loading terminal;
- a second bridging path, comprising:
  - a third bridging resistance electrically connected between the negative output of the amplifier and the positive measurement end, and
  - a fourth bridging resistance electrically connected between the positive measurement end and the positive output of the loading terminal.

5. The communication apparatus according to claim 4, wherein the measurement circuit comprises:
- a positive measurement resistance, electrically connected between the positive output of the amplifier and the positive output of the loading terminal, wherein during the estimation process, the measurement circuit uses a plurality of estimated magnitudes to set the positive measurement resistance, and correspondingly measures the voltage difference between the common bias voltage and the positive measurement end in response to each of the plurality of estimated magnitudes to obtain a plurality of positive voltage differences.

6. The communication apparatus according to claim 5, wherein based on a comparison of the plurality of positive voltage differences, the measurement circuit estimates magnitude of the positive loading resistance by selecting one of the plurality of estimated magnitudes, wherein the estimated magnitude being selected corresponds to minimum of the plurality of positive voltage differences.

7. The communication apparatus according to claim 4, wherein the measurement circuit comprises:
- a negative measurement resistance, electrically connected between the negative output of the amplifier and the negative output of the loading terminal, wherein during the estimation process, the measurement circuit uses a plurality of estimated magnitudes to set the negative measurement resistance, and correspondingly measures the voltage difference between the common bias voltage and the negative measurement end in response to each of the plurality of estimated magnitudes to obtain a plurality of negative voltage differences.

8. The communication apparatus according to claim 7, wherein based on a comparison of the plurality of negative voltage differences, the measurement circuit estimates magnitude of the negative loading resistance by selecting one of the plurality of estimated magnitudes, wherein the estimated magnitude being selected corresponds to minimum of the plurality of negative voltage differences.

9. The communication apparatus according to claim 1, wherein the transmitter and/or the connector adjust resistance settings according to the estimated positive loading resistance and the estimated negative loading resistance.

10. The communication apparatus according to claim 9, wherein the measurement circuit comprises:
- a positive measurement resistance, electrically connected between the transmitter and the loading terminal; and
- a negative measurement resistance, electrically connected between the transmitter and the loading terminal,
- wherein the measurement circuit adjusts the negative measurement resistance according to the estimated positive loading resistance, and adjusts the positive measurement resistance according to the estimated negative loading resistance.

11. The communication apparatus according to claim 10, wherein the measurement circuit sets the estimated positive loading resistance to be equivalent to the negative measurement resistance, and sets the estimated negative loading resistance to be equivalent to the positive measurement resistance.

12. The communication apparatus according to claim 9, wherein the analog output signal comprises a positive transmission signal and a negative transmission signal, and the transmitter comprises:
- an amplifier, having a positive input, a negative input, a positive output, and a negative output;
- a first resistance at the positive source, electrically connected between a positive signal source and the positive input of the amplifier;
- a second resistance at the positive source, electrically connected between the positive input and the positive output of the amplifier, wherein the positive transmission signal is outputted through the positive output of the amplifier;
- a first resistance at the negative source, electrically connected between a negative signal source and the negative input of the amplifier; and
- a second resistance at the negative source, electrically connected between the negative input and the negative output of the amplifier, wherein the negative transmission signal is outputted through the negative output of the amplifier.

13. The communication apparatus according to claim 12, wherein the measurement circuit sets the positive measurement resistance to be equivalent to the estimated positive loading resistance, and sets the negative measurement resistance to be equivalent to the estimated negative loading resistance.

14. The communication apparatus according to claim 12, wherein the transmitter adjusts the magnitude of the second resistance at the positive source according to the estimated positive loading resistance, and adjusts the magnitude of the second resistance at the negative source according to the estimated negative loading resistance.

15. The communication apparatus according to claim 14, wherein after the second resistance at the positive source and the second resistance at the negative source are adjusted, the ratio of the positive loading resistance to the negative loading resistance is equivalent to the ratio of the second resistance at the positive source to the second resistance at the negative source.

16. The communication apparatus according to claim 12, wherein the transmitter adjusts the first resistance at the negative source according to the estimated positive loading resistance, and adjusts the first resistance at the positive source according to the estimated negative loading resistance.

17. The communication apparatus according to claim 16, wherein after the first resistance at the negative source and the first resistance at the positive source are adjusted, the ratio of the positive loading resistance to the negative loading resistance is equivalent to the ratio of the first resistance at the negative source to the first resistance at the positive source.

18. A resistance estimation method used in a communication apparatus electrically connected to a loading terminal and operating at a common bias voltage, wherein the communication apparatus comprises a transmitter, a connector, and a receiver, the transmitter transmits an analog output signal, the connector comprises a bridging circuit and a measurement circuit, the bridging circuit has a positive measurement end and a negative measurement end, and the estimation method comprises steps of:

- transmitting an analog output signal by the transmitter;
- providing the common bias voltage to the receiver during an estimation process; and
- estimating a positive loading resistance and a negative loading resistance corresponding to the loading terminal by the measurement circuit, wherein the positive loading resistance and the negative loading resistance are estimated according to a voltage difference between the common bias voltage and voltage at one of the positive measurement end and the negative measurement end during the estimation process.

19. The estimation method according to claim 18, wherein after the estimation process terminates, the receiver receives an analog input signal through the positive measurement end and the negative measurement end.

20. The estimation method according to claim 18, wherein during the estimation process, the step of estimating the positive loading resistance and the negative loading resistance corresponding to the loading terminal by the measurement circuit according to a voltage difference between the common bias voltage and the voltage at one of the positive measurement and the negative measurement end during the estimation process comprises following steps of:

- estimating the positive loading resistance by the measurement circuit according to a voltage difference between the common bias voltage and the voltage at the positive measurement end; and
- estimating the negative loading resistance by the measurement circuit according to a voltage difference between the common bias voltage and the voltage at the negative measurement end.

21. The estimation method according to claim 20, wherein during the estimation process, the step of estimating a positive loading resistance and a negative loading resistance corresponding to the loading terminal by the measurement circuit according to a voltage difference between the common bias voltage and the voltage at one of the positive measurement end and the negative measurement end comprises following steps of:

- respectively using a plurality of magnitudes to set the positive measurement resistance;
- correspondingly measuring the voltage difference between the common bias voltage and the positive measurement end in response to each of the plurality of estimated magnitudes to obtain a plurality of positive voltage differences; and
- estimating magnitude of the positive loading resistance by selecting one of the plurality of estimated magnitudes, wherein the estimated magnitude being selected corresponds to minimum of the plurality of positive voltage differences.

22. The estimation method according to claim 20, wherein the step of during the estimation process, the measurement circuit estimating the positive loading resistance and the negative loading resistance corresponding to the loading terminal according to a voltage difference between the common bias voltage, and voltage at one of the positive measurement end and the negative measurement end further comprising steps of:

- respectively setting the negative measurement resistance with a plurality of estimated magnitudes;
- correspondingly measuring the voltage difference between the common bias voltage and the negative measurement end in response to each of the plurality of estimated magnitudes to obtain a plurality of negative voltage differences; and
- estimating magnitude of the negative loading resistance by selecting one of the plurality of estimated magnitudes, wherein the estimated magnitude being selected corresponds to minimum of the plurality of negative voltage differences.

23. The estimation method according to claim 18, further comprising steps of:

- the transmitter and/or the connector adjusting resistance settings according to estimated positive loading resistance and the estimated negative loading resistance.

24. The estimation method according to claim 23, wherein the measurement circuit comprises a positive measurement resistance electrically connected between the transmitter and the loading terminal, and a negative measurement resistance electrically connected between the transmitter and the loading terminal, and the step of the transmitter and/or the connector adjusting resistance settings according to estimated positive loading resistance and the estimated negative loading resistance comprising steps of:

- adjusting the negative measurement resistance according to the estimated positive loading resistance; and
- adjusting the positive measurement resistance according to the estimated negative loading resistance.

25. The estimation method according to claim 24, wherein the measurement circuit sets the negative measurement resistance to be equivalent to the estimated positive loading resistance, and sets the positive measurement resistance to be equivalent to the estimated negative loading resistance.

26. The estimation method according to claim 23, wherein the transmitter comprises an amplifier, a first resistance at a positive source, a second resistance at the positive source, a first resistance at a negative source, and a second resistance at the negative source, wherein

- the amplifier has a positive input, a negative input, a positive output, and a negative output;
- the first resistance at the positive source is electrically connected to a positive signal source, and the positive input of the amplifier;
- the second resistance at the positive source is electrically connected to the positive input of the amplifier, and the positive output of the amplifier;
- the first resistance at the negative source is electrically connected to a negative signal source, and the negative input of the amplifier; and
- the second resistance at the negative source is electrically connected to the negative input of the amplifier, and the negative output of the amplifier.

27. The estimation method according to claim 26, wherein the step of the transmitter and/or the connector adjusting resistance settings according to estimated positive loading resistance and the estimated negative loading resistance comprises following steps of:

- setting the positive measurement resistance to be equivalent to the estimated positive loading resistance;
- setting the negative measurement resistance to be equivalent to the estimated negative loading resistance;
- adjusting the second resistance at the positive source according to the estimated positive loading resistance; and
- adjusting the second resistance at the negative source according to the estimated negative loading resistance.

28. The estimation method according to claim 27, wherein after the second resistance at the positive source and the second resistance at the negative source are adjusted, the ratio of the positive loading resistance to the negative loading resistance is equivalent to the ratio of the second resistance at the positive source to the second resistance at the negative source.

29. The estimation method according to claim 26, wherein the step of adjusting resistance settings by the transmitter and/or the connector according to the estimated positive loading resistance and the negative loading resistance comprises following steps of:
   setting the positive measurement resistance to be equivalent to the estimated positive loading resistance;
   setting the negative measurement resistance to be equivalent to the estimated negative loading resistance;
   adjusting the first resistance at the negative source according to the estimated positive loading resistance; and
   adjusting the first resistance at the positive source according to the estimated negative loading resistance.

30. The estimation method according to claim 29, wherein after the first resistance at the negative source and the first resistance at the positive source are adjusted, the ratio of the positive loading resistance to the negative loading resistance is equivalent to the ratio of the first resistance at the negative source to the first resistance at the positive source.

\* \* \* \* \*